US012757429B2

(12) United States Patent
Huang

(10) Patent No.: US 12,757,429 B2
(45) Date of Patent: Oct. 6, 2026

(54) SEMICONDUCTOR DEVICE INCLUDING MULTIPLE SPACERS AND METHOD FOR PREPARING THE SAME

(71) Applicant: NANYA TECHNOLOGY CORPORATION, New Taipei City (TW)

(72) Inventor: Chih-Wei Huang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 354 days.

(21) Appl. No.: 18/507,406

(22) Filed: Nov. 13, 2023

(65) Prior Publication Data

US 2025/0159922 A1 May 15, 2025

(51) Int. Cl.

| | |
|---|---|
| ***H01L 29/78*** | (2006.01) |
| ***H10B 12/00*** | (2023.01) |
| ***H10D 30/60*** | (2025.01) |
| ***H10D 64/01*** | (2025.01) |
| ***H10D 64/23*** | (2025.01) |

(52) U.S. Cl.

CPC ........... *H10D 30/601* (2025.01); *H10B 12/31* (2023.02); *H10D 64/021* (2025.01); *H10D 64/258* (2025.01)

(58) Field of Classification Search

CPC .. H10D 30/601; H10D 64/258; H10D 64/021; H10B 12/31

USPC .......................................................... 257/300

See application file for complete search history.

(56) References Cited

U.S. PATENT DOCUMENTS

2007/0128786 A1* 6/2007 Cheng .................. H10D 64/021 438/300
2009/0085123 A1* 4/2009 Sato ..................... H10D 62/021 257/E29.128
2009/0174002 A1* 7/2009 Ouyang ............. H10D 30/0217 438/231
2011/0159657 A1 6/2011 Griebenow et al.
2012/0156837 A1* 6/2012 Scheiper ............ H10D 84/0184 257/E21.409
2013/0015509 A1* 1/2013 Haran ................ H10D 30/6715 257/E21.409
2017/0194493 A1* 7/2017 Kwon .................. H10D 64/017
2018/0277442 A1 9/2018 Leobandung (Continued)

FOREIGN PATENT DOCUMENTS

TW 200511376 A 3/2005
TW 200511519 A 3/2005

(Continued)

OTHER PUBLICATIONS

Office Action and and the search report mailed on Aug. 18, 2025 related to Taiwanese Application No. 113120989.
Office Action and and the search report mailed on Sep. 8, 2025 related to Taiwanese Application No. 113101054.
Summary translations of Office Actions and and the search reports mailed on Aug. 18, 2025 related to Taiwanese Application No. 113120989 and Sep. 8, 2025 related to Taiwanese Application No. 113101054.

(Continued)

*Primary Examiner* — Dzung Tran
(74) *Attorney, Agent, or Firm* — Xuan Zhang

(57) ABSTRACT

A semiconductor device and a method for preparing the semiconductor structure are provided. The semiconductor device includes a substrate; a gate electrode disposed on the substrate; a first metal contact disposed in the gate electrode; a first spacer disposed on a sidewall of the gate electrode; and a second spacer covering the first spacer; wherein the first spacer includes dopants.

11 Claims, 22 Drawing Sheets

(56) References Cited

U.S. PATENT DOCUMENTS

| | | | | |
|---|---|---|---|---|
| 2020/0343359 | A1* | 10/2020 | Liaw | H10D 64/015 |
| 2021/0226030 | A1* | 7/2021 | Min | H10D 30/62 |
| 2022/0310807 | A1 | 9/2022 | Chou | |
| 2022/0384606 | A1 | 12/2022 | Chien et al. | |

FOREIGN PATENT DOCUMENTS

| | | | |
|---|---|---|---|
| TW | 200832561 | A | 8/2008 |
| TW | 200910526 | A | 3/2009 |
| TW | 201044579 | A | 12/2010 |
| TW | 201117301 | A | 5/2011 |
| TW | 201517269 | A | 5/2015 |
| TW | 202008569 | A | 2/2020 |
| TW | 202215539 | A | 4/2022 |
| TW | 202238901 | A | 10/2022 |
| TW | 202243117 | A | 11/2022 |

OTHER PUBLICATIONS

Office Action and and the search report mailed on Jan. 20, 2025 related to Taiwanese Application No. 113101054.
Summary translation of Office Action and and the search report mailed on Jan. 20, 2025 and Mar. 19, 2025 related to Taiwanese Application No. 113101054.
Office Action and and the search report mailed on Mar. 19, 2025 related to Taiwanese Application No. 113101054.
Office Action and and the search report mailed on May 19, 2025 related to Taiwanese Application No. 113101054.
Office Action and and the search report mailed on Jul. 18, 2025 related to Taiwanese Application No. 113101054.
Summary translations of Office Actions and and the search reports mailed on May 19, 2025 and Jul. 18, 2025 related to Taiwanese Application No. 113101054.

* cited by examiner

SEMICONDUCTOR DEVICE INCLUDING MULTIPLE SPACERS AND METHOD FOR PREPARING THE SAME

TECHNICAL FIELD

The present disclosure relates to a semiconductor device and a method for preparing the semiconductor device, and in particular to a semiconductor device including a spacer structure with two or more spacers and a method for preparing the semiconductor device.

DISCUSSION OF THE BACKGROUND

With the rapid growth of the electronics industry, the development of integrated circuits (ICs) has achieved high performance and miniaturization. Technological advances in IC materials and design have resulted in repeated evolutions of IC development, each of which provides increasingly smaller and more complex circuits.

A dynamic random-access memory (DRAM) device is a type of random-access memory that stores each bit of data in a separate capacitor within an integrated circuit. Typically, a DRAM is arranged in a square array with one capacitor and transistor per cell. A vertical transistor has been developed for the $4F^2$ DRAM cell, where F represents the photolithographic minimum feature dimension or critical dimension (CD). In advanced DRAM technology, in addition to reducing the DRAM array cell size, it is also very important to reduce sizes of core and peripheral circuits. In typical CMOS circuits, the core circuit achieves the tightest pitch design rule, especially in sense amplifier and subwordline driver circuits. However, the core circuit design rule for 10 nm node DRAM is starting to challenge the control gate (GC) space rule with adequate spacer to well form in the GC-GC space, especially from 1B nm generation and even more advanced node, such as 1C nm and beyond.

Currently, in 1B nm node, it is only done with reducing the GC spacer oxide thickness. But it will impact the overall transistor short channel performance since the deep source/drain (S/D) junction formed by lightly-doped drain (LDD) implant.

In the current environment, DRAM manufacturers face the tremendous challenge of further reducing memory cell area. Further, sizes of peripheral regions of the DRAM should be reduced correspondingly, which complicates manufacturing processes.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate; a gate electrode disposed on the substrate; a first metal contact disposed in the gate electrode; a first spacer disposed on a sidewall of the gate electrode; and a second spacer covering the first spacer, wherein the first spacer is doped.

Another aspect of the present disclosure provides a semiconductor device. The semiconductor device includes a substrate; a gate electrode disposed on the substrate; a first metal contact disposed in the gate electrode; a first spacer disposed on a sidewall of the gate electrode; and a trench capacitor disposed over the first metal contact and being in contact with the first metal contact.

Another aspect of the present disclosure provides a method for manufacturing a semiconductor device. The method includes: providing a substrate and forming a first gate electrode and a second gate electrode over the substrate; forming a first lightly-doped region within the substrate and between the first gate electrode and the second gate electrode; forming a first dielectric layer to cover the first gate electrode, the second gate electrode, and the substrate; performing an etching technique to pattern the first dielectric layer; forming a first spacer on a sidewall of the first gate electrode; forming a second spacer on a sidewall of the second gate electrode, wherein the substrate is exposed through the first spacer and the second spacer; forming a second lightly-doped region within the substrate and between the first spacer and the second spacer; forming a second dielectric layer to cover the first spacer, the second spacer, the first gate electrode, the second gate electrode, and the substrate; performing an etching technique to pattern the second dielectric layer; forming a third spacer to cover the first spacer; forming a fourth spacer to cover the second spacer, wherein the substrate is exposed through the spacers; forming a heavily-doped region within the substrate and between the third spacer and the fourth spacer; forming first metal contacts in the first gate electrode and the second gate electrode; forming a second metal contact in the heavily-doped region between the first gate electrode and the second gate electrode; forming a first dielectric structure over the substrate and between the first gate electrode and the second gate electrode; forming a second dielectric structure over the first dielectric structure; forming a third dielectric structure over the second dielectric structure; and forming a trench capacitor to penetrate the third dielectric structure and the second dielectric structure to reach and contact the first metal contacts formed in the first gate electrode and the second gate electrode.

The embodiments of the present disclosure provide a method for preparing a semiconductor device. The method includes a deposition-etch-deposition-etch (DEDE) process instead of a single-deposition/single-etch process, wherein the DEDE process defines multiple spacers, to sustain a spacer precisely formed in the tight pitch area. Further, due to performing of multiple cycles of forming spacers, spacer dimensions can be reduced.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the figures, where like reference numbers refer to similar elements throughout the figures, and:

DETAILED DESCRIPTION

Figure 1:
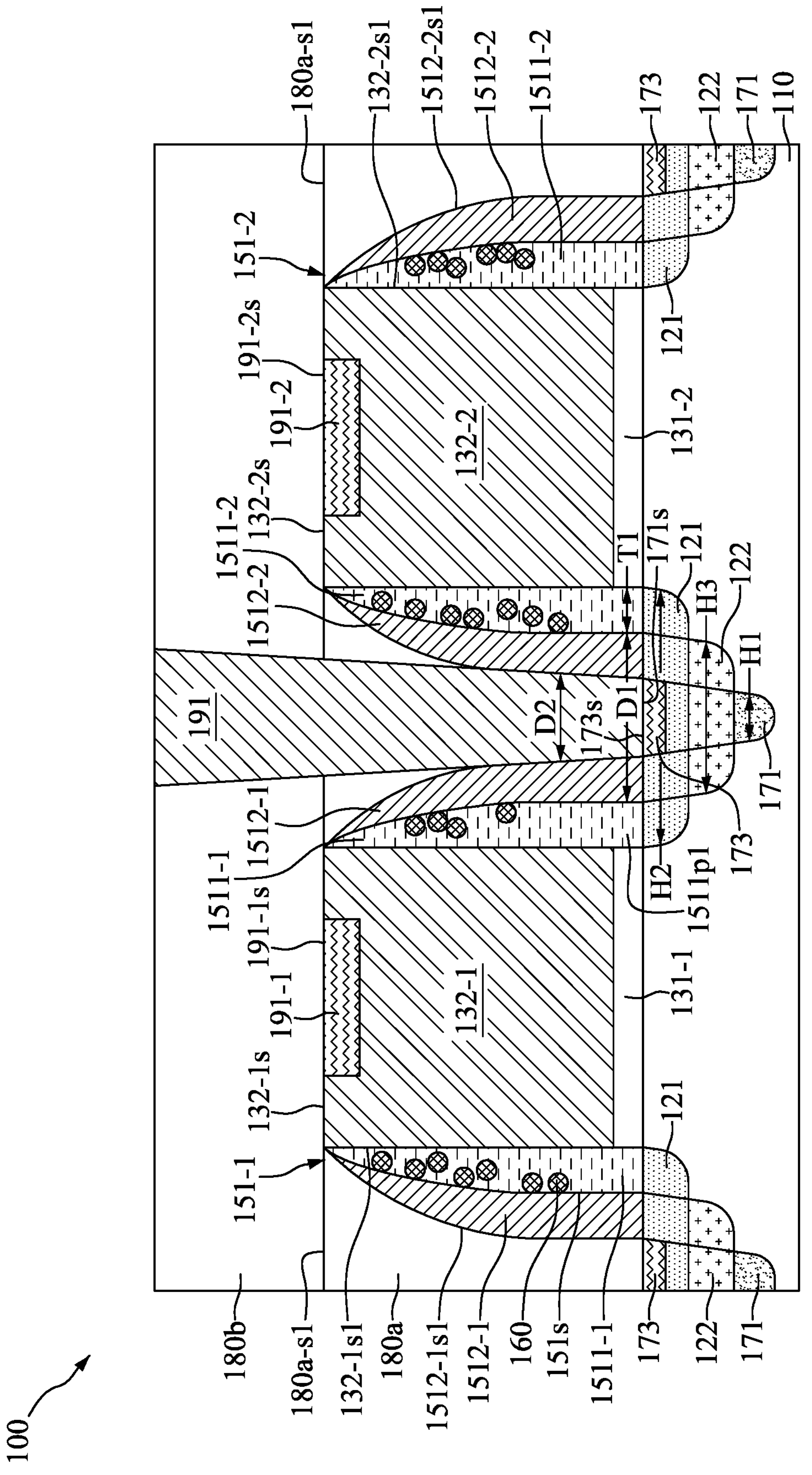
FIG. 1 is a cross-sectional view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or the connection between the two elements may involve other intervening elements.

It shall be understood that, although the terms such as first, second, third, etc. may be used herein to describe various elements, components, regions, layers or sections, such elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a cross-sectional view of a semiconductor device 100, in accordance with some embodiments of the present disclosure.

The semiconductor device 100 may include an array region (not shown) and a peripheral region (not shown). The array region may be at least partially surrounded by the peripheral region. The array region may be utilized to form a memory device. The memory device can include, for example, a dynamic random-access memory (DRAM) device, a one-time programming (OTP) memory device, a static random-access memory (SRAM) device, or other suitable memory devices. A plurality of pillars may be formed within the array region. Each of the pillars may include a capacitor and other suitable structures. The array region may include transistors to turn on and/or turn off the memory device.

In some embodiments, the peripheral region may be utilized to form, for example, an amplify circuit, or other suitable circuits. The circuits within the peripheral region may be signally and/or electrically coupled to the components (e.g., capacitors and transistors) in the array region.

The semiconductor device 100 may include a substrate 110. The aforesaid components of the array region and the peripheral region may be formed within and/or on the substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient SiGe feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the semiconductor device 100 may further include first and second gate dielectric layers 131-1 and 131-2, first and second gate electrodes 132-1 and 132-2, spacer structures 151-1 and 151-2, a heavily-doped region 171, first and second dielectric structures **180*a* and 180*b*, and a conductive element 191**.

In some embodiments, each of the gate dielectric layers 131-1 and 131-2 may be disposed on the substrate 110. Each of the gate dielectric layers 131-1 and 131-2 may have a single layer or may comprise a multilayered structure. In some embodiments, each of the gate dielectric layers 131-1 and 131-2 may include a dielectric material, such as silicon oxide, silicon nitride, silicon oxynitride, other dielectric materials, or a combination thereof. In some embodiments, each of the gate dielectric layers 131-1 and 131-2 is a multilayered structure that includes an interfacial layer and a high-k dielectric layer (i.e., having a dielectric constant greater than 4). The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal oxides, transition metal nitrides, transition metal silicates, metal oxynitrides, metal aluminates, and combinations thereof.

In some embodiments, each of the gate electrodes 132-1 and 132-2 may be disposed on the substrate 110. The first gate electrode 132-1 may be disposed on the first gate dielectric layer 131-1. The second gate electrode 132-2 may be disposed on the second gate dielectric layer 131-2.

Each of the gate electrodes 132-1 and 132-2 may include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, each of the gate electrodes 132-1 and 132-2 includes a work function metal layer that provides a metal gate with an n-type-metal work function or a p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

In some embodiments, the spacer structure 151-1 may be disposed on a surface **132-1*s*1 of the first gate electrode 132-1. In some embodiments, the spacer structure 151-1 may be disposed on a sidewall (not indicated in FIG. 1) of the first gate dielectric layer 131-1. The spacer structure 151-1 may include a spacer 1511-1 and a spacer 1512-1**.

In some embodiments, the spacer 1511-1 may be disposed on the surface **132-1*s*1 of the first gate electrode 132-1. The spacer 1511-1 may be disposed between the spacer 1512-1 and the first gate electrode 132-1. The spacer 1511-1** may include a dielectric material, such as silicon oxide, silicon nitride, silicon oxynitride, other dielectric materials, or a combination thereof.

In some embodiments, the spacer 1511-1 may be doped with dopants 160. Each of the dopants 160 may have a p-type conductivity or an n-type conductivity. In some embodiments, p-type dopants may include boron (B), other group III elements, or any combination thereof.

In some embodiments, n-type dopants may include arsenic (As), phosphorus (P), other group V elements, or any combination thereof.

In some embodiments, the dopants 160 may be located adjacent to the surface **151*s* of the spacer 1511-1. The surface 151*s* may also be considered as an interface between the spacers 1511-1 and 1512-1**.

In some embodiments, the spacer 1512-1 may be disposed on the spacer 1511-1. In some embodiments, the spacer 1512-1 may cover the spacer 1511-1. The spacers 1511-1 and 1512-1 may be formed by two cycles of depositing and patterning (or etching) dielectric layers. In some embodiments, the spacer 1512-1 may cover the surface **151*s* of the spacer 1511-1. The spacer 1512-1 may include a dielectric material, such as silicon oxide, silicon nitride, silicon oxynitride, other dielectric materials, or a combination thereof. In some embodiments, the material of the spacer 1512-1 may be same as that of the spacer 1511-1. In some embodiments, the material of the spacer 1512-1 may be different from that of the spacer 1511-1. The spacer 1512-1 may have a surface 1512-1*s*1 (or an external surface) facing away from the spacer 1511-1. In some embodiments, a surface roughness of the surface 151*s* may be greater than a surface roughness of the surface 1512-1*s*1**.

In some embodiments, the spacer structure 151-2 may be disposed on a surface **132-2*s*1 of the second gate electrode 132-2. In some embodiments, the spacer structure 151-2 may be disposed on a sidewall (not indicated in FIG. 1) of the second gate dielectric layer 131-2. The spacer structure 151-2 may include a spacer 1511-2 and a spacer 1512-2**.

In some embodiments, the spacer 1511-2 may be disposed on the surface 132-2_s_1 of the second gate electrode 132-2. The spacer 1511-2 may be disposed between the spacer 1512-2 and the second gate electrode 132-2. The spacer 1511-2 may include a dielectric material, such as silicon oxide, silicon nitride, silicon oxynitride, other dielectric materials, or a combination thereof. The material of the spacer 1511-2 may be same as that of the spacer 1511-1. In some embodiments, the spacer 1511-2 may be doped with dopants 160.

In some embodiments, the spacer 1512-2 may be disposed on the spacer 1511-2. In some embodiments, the spacer 1512-2 may cover the spacer 1511-2. The spacers 1511-2 and 1512-2 may be formed by two cycles of depositing and patterning (or etching) dielectric layers. The spacer 1512-2 may include a dielectric material, such as silicon oxide, silicon nitride, silicon oxynitride, other dielectric materials, or a combination thereof. In some embodiments, the material of the spacer 1512-2 may be same as that of the spacer 1511-2. In some embodiments, the material of the spacer 1512-2 may be different from that of the spacer 1511-2.

In some embodiments, the heavily-doped region 171 may be formed within the substrate 110. In some embodiments, the heavily-doped region 171 may be located between the spacer structures 151-1 and 151-2. In some embodiments, the heavily-doped region 171 may be located between the spacers 1512-1 and 1512-2. In some embodiments, the heavily-doped region 171 may be outside an area overlapped by the spacer 1511-1 along a Z direction. In some embodiments, the heavily-doped region 171 may be outside an area overlapped by the spacer 1511-2 along the Z direction. The heavily-doped region 171 may serve as a source region or a drain region of the semiconductor device 100. The heavily-doped region 171 may include p-type dopants or n-type dopants.

In some embodiments, the heavily-doped region 171 may have a dimension H1 (e.g., width or length) along an X direction. In some embodiments, the dimension H1 of the heavily-doped region 171 may be determined by dimensions (not indicated in FIG. 1) of the spacer structures 151-1 and 151-2.

A top surface 180_a_-_s_1 of the first dielectric structure 180_a_ may be coplanar with a top surface 132-1_s_ of the first gate electrode 132-1. The top surface 180_a_-_s_1 of the first dielectric structure 180_a_ may be coplanar with a top surface 132-2_s_ of the second gate electrode 132-2. The first dielectric structure 180_a_ may cover the spacer structure 151-1. The first dielectric structure 180_a_ may cover the spacer structure 151-2. The first dielectric structure 180_a_ may cover the spacer 1511-1. The first dielectric structure 180_a_ may cover the spacer 1512-1. The first dielectric structure 180_a_ may cover the spacer 1511-2. The first dielectric structure 180_a_ may cover the spacer 1512-2. The second dielectric structure 180_b_ may cover the first dielectric structure 180_a_. In some embodiments, the first dielectric structure 180_a_ and the second dielectric structure 180_b_ may include a dielectric material, such as silicon oxide, silicon nitride, silicon oxynitride, other dielectric materials, or a combination thereof.

In some embodiments, the conductive element 191 may be disposed on the substrate 110. In some embodiments, the conductive element 191 may be disposed between the spacer structures 151-1 and 151-2. In some embodiments, the conductive element 191 may penetrate the dielectric structures 180_a_ and 180_b_. In some embodiments, the conductive element 191 may be in contact with the spacer structure 151-1. In some embodiments, the conductive element 191 may be in contact with the spacer 1512-1. In some embodiments, the conductive element 191 may be separated from the spacer 1511-1 by the spacer 1512-1. The conductive element 191 may be connected (e.g., electrically connected) to the heavily-doped region 171. In some embodiments, the conductive element 191 may include conductive materials, such as tungsten (W), copper (Cu), aluminum (Al), tantalum (Ta), molybdenum (Mo), tantalum nitride (TaN), titanium, titanium nitride (TiN), the like, or a combination thereof.

Sizes of components and/or distances between components in a peripheral region are reduced by miniaturization of the memory device (e.g., the components in the array region). For example, a size of a source/drain region (e.g., the heavily-doped region 171), a size of a gate electrode (e.g., the gate electrodes 132-1 and 132-2), and a distance between the gate electrodes 132-1 and 132-2 in the peripheral region are reduced. However, to achieve a required electrical property of the semiconductor device 100, a dimension (e.g., thickness) of spacer structures (e.g., the spacer structures 151-1 and 151-2) cannot be reduced proportionally. In a comparative example, a spacer is formed by one cycle of depositing and patterning a dielectric layer. The dielectric layer deposited between the gate electrodes may have a significant thickness. As a result, after an etching technique is performed, the dielectric layer may remain over a region in which a heavily-doped region (e.g., a source/drain region) is formed. Therefore, the heavily-doped region cannot be formed properly. To resolve such issue, in some embodiments of the present disclosure, a spacer structure (e.g., the spacer structures 151-1 and 151-2) may be formed by at least two cycles of depositing and patterning a dielectric layer, which ensures that the dielectric layers may be patterned properly. As a result, the heavily-doped region 171 may be properly formed within the substrate 110.

In some embodiments, the semiconductor device 100 may further include a lightly-doped region 121 and a lightly-doped region 122.

In some embodiments, the lightly-doped region 121 may be located within the substrate 110. The lightly-doped region 121 may be located between the spacer structures 151-1 and 151-2. In some embodiments, the lightly-doped region 121 may be overlapped by the spacer 1511-1 along the Z direction. In some embodiments, the lightly-doped region 121 may be overlapped by the spacer 1512-1 along the Z direction. In some embodiments, the lightly-doped region 121 may be overlapped by the spacer 1511-2 along the Z direction. In some embodiments, the lightly-doped region 121 may be overlapped by the spacer 1512-2 along the Z direction. The lightly-doped region 121 may overlap the heavily-doped region 171. The lightly-doped region 121 may function as a lightly-doped source (LDS) or a lightly-doped drain (LDD). A dopant concentration of the lightly-doped region 121 may be less than that of the heavily-doped region 171. The lightly-doped region 121 may have a conductivity type same as that of the heavily-doped region 171. In some embodiments, the lightly-doped region 121 may have a dimension H2 (e.g., width or length) along the X direction. In some embodiments, the dimension H2 of the lightly-doped region 121 may be determined by a distance (not indicated in FIG. 1) between the gate electrodes 132-1 and 132-2.

In some embodiments, the lightly-doped region 122 may be located within the substrate 110. The lightly-doped region 122 may be located between the spacers 1511-1 and 1511-2. In some embodiments, the lightly-doped region 121 may be overlapped by the spacer 1512-1 along the Z direction. In some embodiments, the lightly-doped region 122 may be optional. In some embodiments, the lightly-doped region 121 may be overlapped by the spacer 1512-2 along the Z direction. In some embodiments, a portion 1511*p*1 of the spacer 1511-1 may overlap an area outside the lightly-doped region 122 along the Z direction. In some embodiments, a portion (not indicated in FIG. 1) of the spacer 1511-2 may overlap an area outside the lightly-doped region 122 along the Z direction. The lightly-doped region 122 may be overlapped by the lightly-doped region 121. The lightly-doped region 122 may overlap the heavily-doped region 171. The lightly-doped region 122 may function as the LDD or the LDS. A dopant concentration of the lightly-doped region 122 may be less than that of the heavily-doped region 171. The dopant concentration of the lightly-doped region 122 may be same as or similar to that of the lightly-doped region 121. The lightly-doped region 122 may have a conductivity type same as that of the heavily-doped region 171. In some embodiments, a dopant of the lightly-doped region 122 may be same as the dopants 160. For example, when the dopants 160 include phosphorus, the lightly-doped region 122 includes phosphorus. In some embodiments, the lightly-doped region 122 may have a dimension H3 (e.g., width or length) along the X direction. In some embodiments, the dimension H3 of the lightly-doped region 122 may be less than the dimension H2 of the lightly-doped region 121.

In some embodiments, the dimension H3 of the lightly-doped region 122 may be determined by a distance D1 between the spacers 1511-1 and 1512-1. In some embodiments, the dimension H3 of the lightly-doped region 122 may be determined by a thickness T1 of the spacers 1511-1 and 1511-2. In some embodiments, the lightly-doped region 122 may have a depth greater than that of the lightly-doped region 121.

In some embodiments, the dimension H1 of the heavily-doped region 171 may be determined by a distance D2 between the spacers 1512-1 and 1512-2. In some embodiments, the heavily-doped region 171 may have a depth greater than that of the lightly-doped region 122.

In some embodiments, the spacer structures 151-1 and 151-2 may be formed by at least two cycles of depositing and patterning dielectric layers, and the dimension H3 of the lightly-doped region 122 may be determined and/or controlled by a spacer formed in a first cycle. Thus, at least two profiles of the LDD (or LDS) may be precisely modified and/or controlled.

In some embodiments, the semiconductor device 100 may further include a second metal contact 173 and first metal contacts 191-1 and 191-2.

In some embodiments, the second metal contact 173 may be disposed in the substrate 110. In some embodiments, the second metal contact 173 may be disposed in the lightly-doped region 121. In some embodiments, the second metal contact 173 may be located between the gate electrodes 132-1 and 132-2. That is, each of the second metal contacts 173 may be located between two adjacent gate electrodes. In some embodiments, the second metal contact 173 may be in contact with the conductive element 191. In some embodiments, the second metal contacts 173 are metal silicide contacts. In some embodiments, a top surface 173*s* of the second metal contact 173 may be coplanar with a top surface 171*s* of the lightly-doped region 121.

In some embodiments, the first metal contact 191-1 may be disposed in the first gate electrode 132-1. In some embodiments, a top surface 191-1*s* of the first metal contact 191-1 may be coplanar with the top surface 132-1*s* of the first gate electrode 132-1. In some embodiments, the first metal contact 191-1 may be in contact with the second dielectric structure 180*b*. In some embodiments, the first metal contact 191-1 is a metal silicide contact.

The first metal contact 191-2 may be disposed in the second gate electrode 132-2. In some embodiments, a top surface 191-2*s* of the first metal contact 191-2 may be coplanar with the top surface 132-12*s* of the second gate electrode 132-2. In some embodiments, the first metal contact 191-2 may be in contact with the second dielectric structure 180*b*. In some embodiments, the first metal contact 191-2 is a metal silicide contact.

Figure 2:
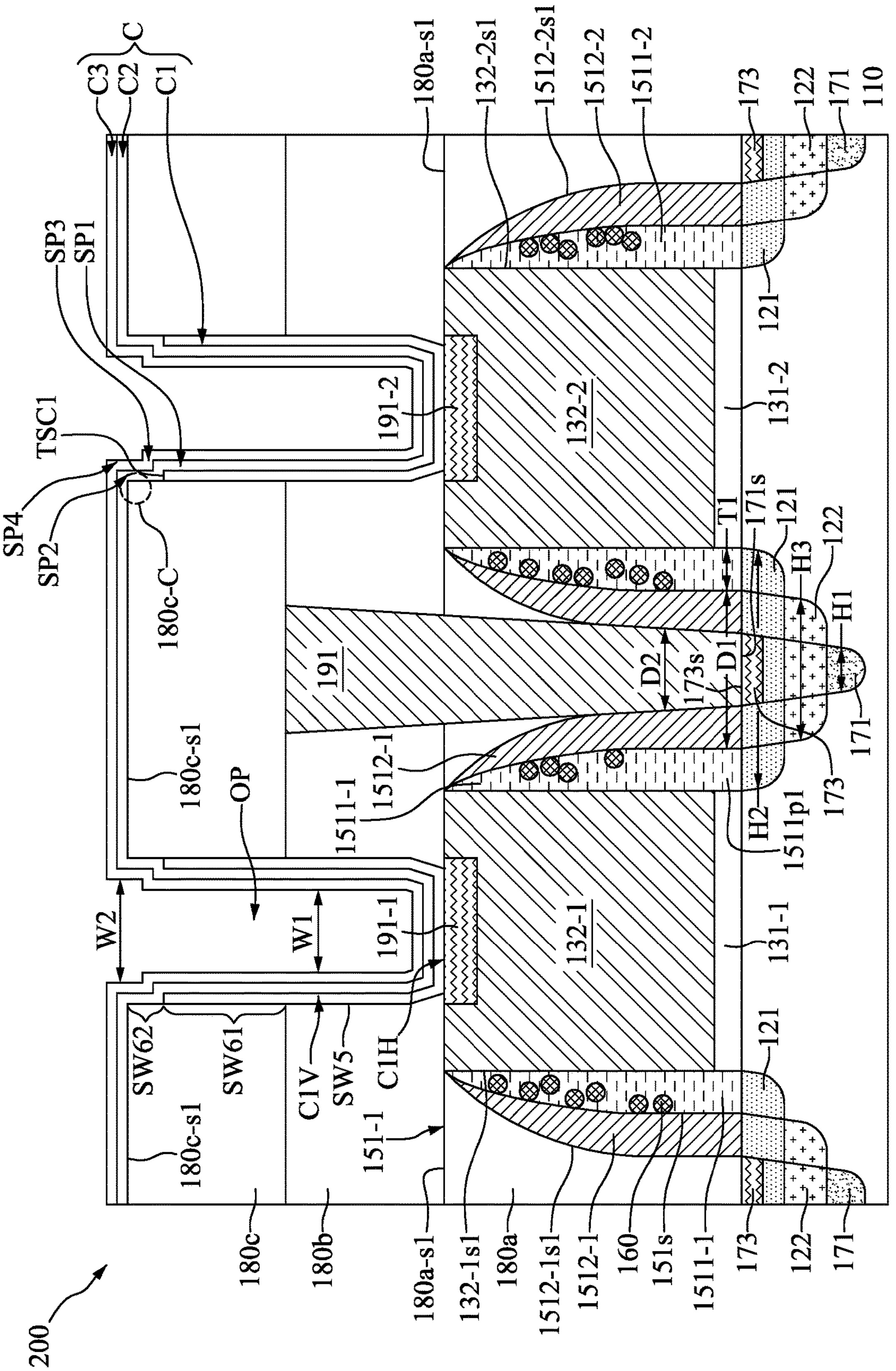
FIG. 2 is a cross-sectional view of a semiconductor device with a trench capacitor, in accordance with some embodiments of the present disclosure.

FIG. 2 is a cross-sectional view of a semiconductor device 200 with a trench capacitor C, in accordance with some embodiments of the present disclosure. The semiconductor device 200 is manufactured from the semiconductor device 100 in FIG. 1. Based on the semiconductor device 100, the semiconductor device 200 further include a third dielectric structure 180*c* and the trench capacitor C.

The third dielectric structure 180*c* is disposed over the second dielectric structure 180*b*. A trench TR (please refer to FIG. 16 for illustration) is formed in the first dielectric structure 180*a*, the second dielectric structure 180*b*, and the third dielectric structure 180*c*. The first metal contact 191-1 may be exposed by the trench TR. The first metal contact 191-2 may also be exposed by the trench TR. Because the structures of the first metal contact 191-1 and the first metal contact 191-2 are same, a drawing of the structure of the first metal contact 191-1 is used as a representative illustration of the first metal contact 191-2, and a drawing of the structure of the first metal contact 191-2 is omitted. The trench TR penetrates the second dielectric structure 180*b*, and the third dielectric structure 180*c* to reach the top surface 191-1*s* of the first metal contact 191-1. The trench capacitor C is disposed in the trench TR.

The trench capacitor C is a metal-insulator-metal structure, which includes a bottom metal layer C1, a middle insulating layer C2, and a top metal layer C3. The bottom metal layer C1 is disposed along a contour of the trench TR. More specifically, the bottom metal layer C1 is disposed to be in contact with the top surface 191-1*s* of the first metal contact 191-1, and to cover a sidewall SW5 of the second dielectric structure 180*b* and a first portion SW61 of a sidewall of the third dielectric structure 180*c*. As illustrated in FIG. 2, the bottom metal layer C1 includes a horizontal portion C1H and a vertical portion C1V. The horizontal portion C1H is in contact with the top surface 191-1*s* of the first metal contact 191-1, and the vertical portion C1V is in contact with the sidewall SW5 of the second dielectric structure 180*b* and the first portion SW61 of the sidewall of the third dielectric structure 180*c*.

The middle insulating layer C2 is disposed to cover the bottom metal layer C1 and the third dielectric structure 180*c*. More specifically, the middle insulating layer C2 is in contact with the bottom metal layer C1, a second portion SW62 of the sidewall of the third dielectric structure 180*c*, and a top surface 180*c*-*s*1 of the third dielectric structure 180*c*. It should be noted that the first portion SW61 and the second portion SW62 of the sidewall of the third dielectric structure are arranged in a substantially straight line. As illustrated in FIG. 2, the middle insulating layer C2 includes a first step portion SP1 and a second step portion SP2. The first step portion SP1 is in contact with a top surface TSC1 of the vertical portion C1V of the bottom metal layer C1, and the second step portion SP2 is in contact with the top surface 180*c*-*s*1 of the third dielectric structure 180*c* and the second portion SW62 of the sidewall of the third dielectric structure 180*c*. Accordingly, the second step portion SP2 of the middle insulating layer C2 is in contact with a corner 180*c*-C (denoted by a dashed circle in FIG. 2) connecting the top surface 180*c*-*s*1 of the third dielectric structure 180*c* to the second portion SW62 of the sidewall of the third dielectric structure 180*c*.

The top metal layer C3 is disposed to cover the middle insulating layer C2. In some embodiments, the top metal layer C3 covers the middle insulating layer C2 in its entirety. The top metal layer C3 includes a first step portion SP3 and a second step portion SP4. The first step portion SP3 of the top metal layer C3 covers the first step portion SP1 of the middle insulating layer C2, and the second step portion SP4 of the top metal layer C3 covers the second step portion SP2 of the middle insulating layer C2.

As illustrated in FIG. 2, a contour of the top metal layer C3 of the trench capacitor C forms an opening OP extending from the third dielectric structure 180*c* to the second dielectric structure 180*b*. The opening OP has a first horizontal width W1 associated with the first step portion SP3 of the top metal layer C3 and a second horizontal width W2 associated with the second step portion SP4 of the top metal layer C3. The second horizontal width W2 is greater than the first horizontal width W1.

In some embodiments, the bottom metal layer C1 includes TiN. In some other embodiments, the bottom metal layer C1 includes titanium silicon nitride (TiSiN). In some embodiments, the middle insulating layer C2 is a high-k dielectric layer including zirconium oxide ($ZrO_2$), hafnium oxide ($HfO_2$), titanium oxide ($TiO_2$), or a combination thereof. In some embodiments, the top metal layer C3 includes TiN. In some other embodiments, the top metal layer C3 includes titanium silicon nitride (TiSiN).

Figure 3:
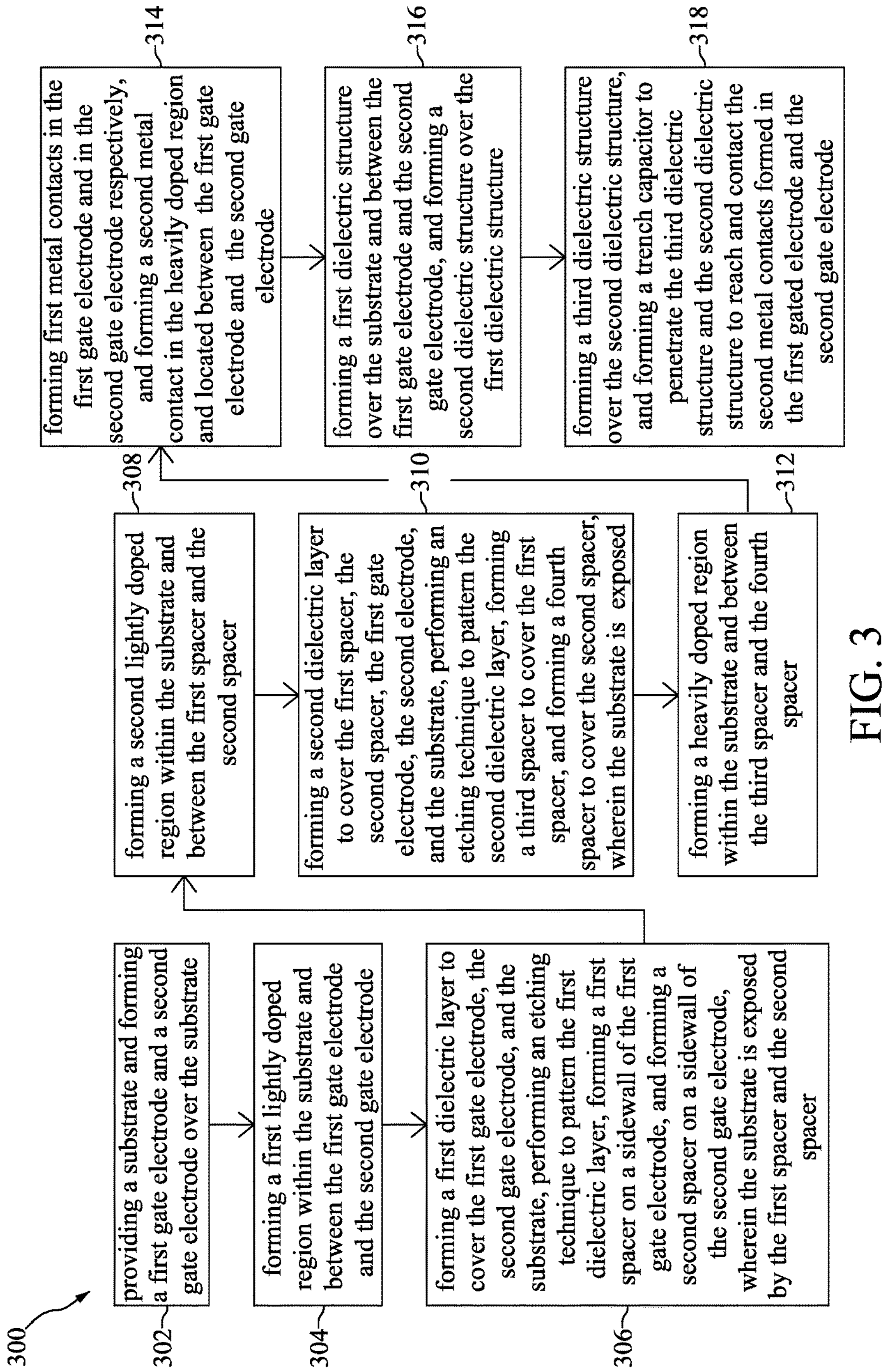
FIG. 3 is a flowchart illustrating a method for preparing a semiconductor device, in accordance with some embodiments of the present disclosure.

FIG. 3 is a flowchart illustrating a method 300 for preparing a semiconductor device, in accordance with some embodiments of the present disclosure.

The method 300 may begin with operation 302, in which a substrate is provided. A first gate electrode and a second gate electrode may be formed over the substrate.

The method 300 may continue with operation 304, in which a first lightly-doped region is formed within the substrate and between the first gate electrode and the second gate electrode.

The method 300 may continue with operation 306, in which a first dielectric layer is formed to cover the first gate electrode, the second gate electrode, and the substrate. An etching technique is performed to pattern the first dielectric layer. A first spacer may be formed on a sidewall of the first gate electrode. A second spacer may be formed on a sidewall of the second gate electrode. The substrate may be exposed by the first spacer and the second spacer.

The method 300 may continue with operation 308, in which a second lightly-doped region is formed within the substrate and between the first spacer and the second spacer.

The method 300 may continue with operation 310, in which a second dielectric layer is formed to cover the first spacer, the second spacer, the first gate electrode, the second gate electrode, and the substrate. An etching technique is performed to pattern the second dielectric layer. A third spacer may be formed to cover the first spacer. A fourth spacer may be formed to cover the second spacer. The substrate may be exposed.

The method 300 may continue with operation 312, in which a heavily-doped region is formed within the substrate and between the third spacer and the fourth spacer.

The method 300 may continue with operation 314, in which first metal contacts are formed in the first gate electrode and the second gate electrode, and a second metal contact is formed in the heavily-doped region and between the first gate electrode and the second gate electrode.

The method 300 may continue with operation 316, in which a first dielectric structure is formed over the substrate and between the first gate electrode and the second gate electrode, and a second dielectric structure is formed over the first dielectric structure.

The method 300 may continue with operation 318, in which a third dielectric structure is formed over the second dielectric structure and a trench capacitor is formed to penetrate the third dielectric structure and the second dielectric structure to reach and contact the first metal contacts formed in the first gate electrode and the second gate electrode.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 3. In some embodiments, the method 300 can include one or more operations depicted in FIG. 3.

FIGS. 4 to 13 illustrate one or more stages of an exemplary method for manufacturing a semiconductor device 100 according to some embodiments of the present disclosure.

Figure 4:
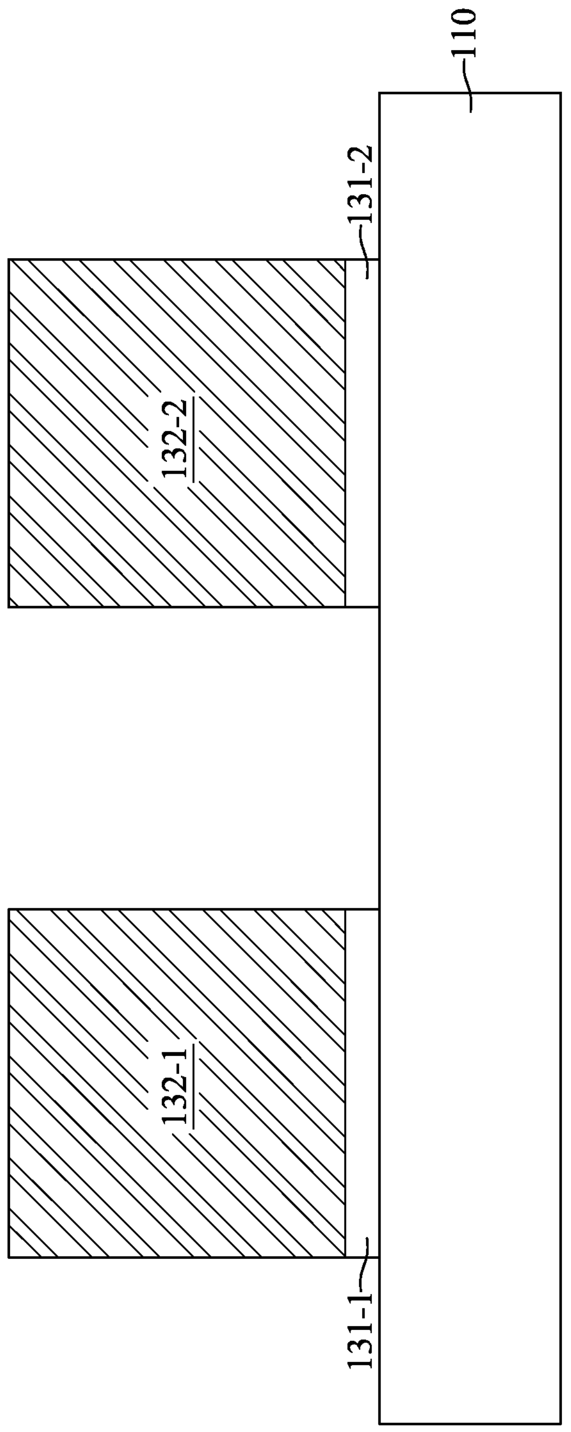
FIG. 4 illustrates one or more stages of an exemplary method for manufacturing a semiconductor device according to some embodiments of the present disclosure.

Referring to FIG. 4, a substrate 110 may be provided. First and second gate dielectric layers 131-1 and 131-2 may be formed on the substrate 110. A first gate electrode 132-1 may be formed on the first gate dielectric layer 131-1. A second gate electrode 132-2 may be formed on the second gate dielectric layer 131-2. Each of the gate dielectric layers 131-1 and 131-2, as well as the gate electrodes 132-1 and 132-2, may be formed by chemical vapor deposition (CVD), atomic layer deposition (ALD), physical vapor deposition (PVD), low-pressure chemical vapor deposition (LPCVD), plasma-enhanced CVD (PECVD), or other suitable processes.

Figure 5:
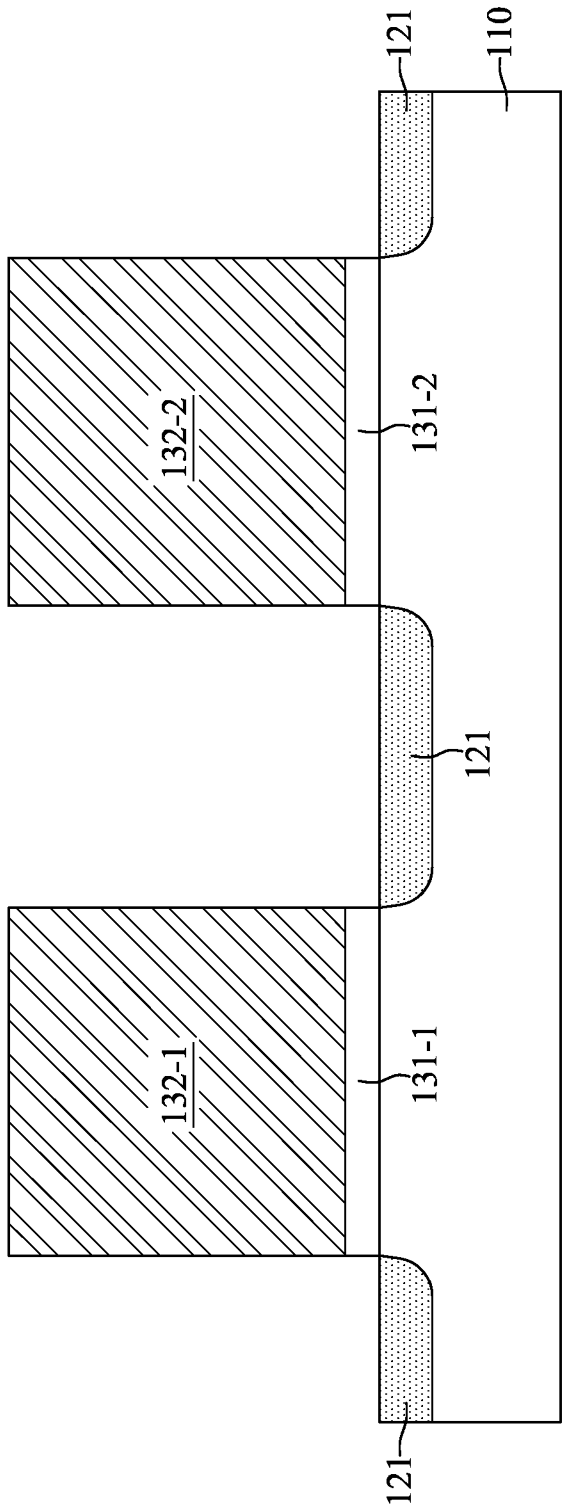
FIG. 5 illustrates one or more stages of an exemplary method for manufacturing a semiconductor device according to some embodiments of the present disclosure.

Referring to FIG. 5, a lightly-doped region 121 may be formed within the substrate 110 and between the gate electrodes 132-1 and 132-2. It should be noted that the step of forming the lightly-doped region 121 may be performed before the step of forming the gate electrodes 132-1 and 132-2.

Figure 6:
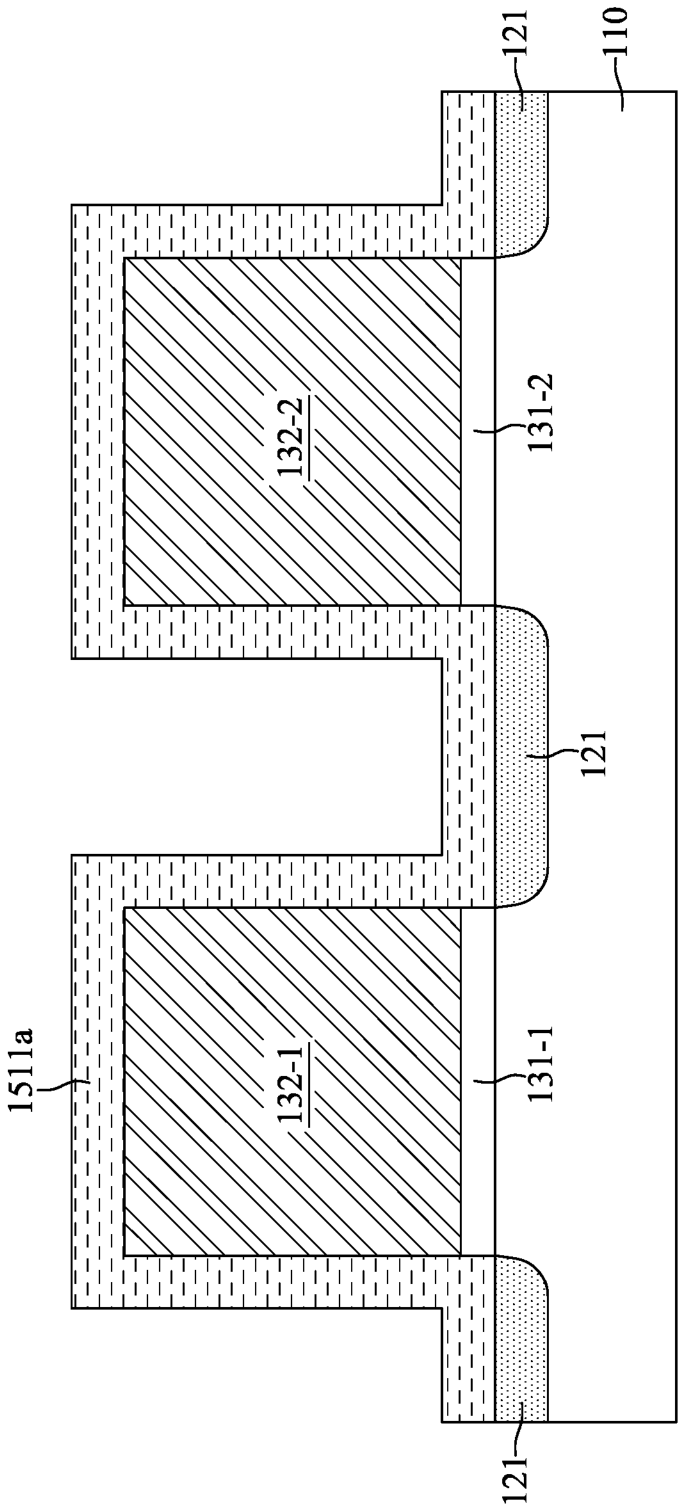
FIG. 6 illustrates one or more stages of an exemplary method for manufacturing a semiconductor device according to some embodiments of the present disclosure.

Referring to FIG. 6, a dielectric layer 1511*a* may be formed to cover the gate electrodes 132-1 and 132-2. The dielectric layer 1511*a* may cover the substrate 110. The dielectric layer 1511*a* may be formed by, for example, CVD, ALD, PVD, LPCVD, PECVD, or other suitable processes.

Figure 7:
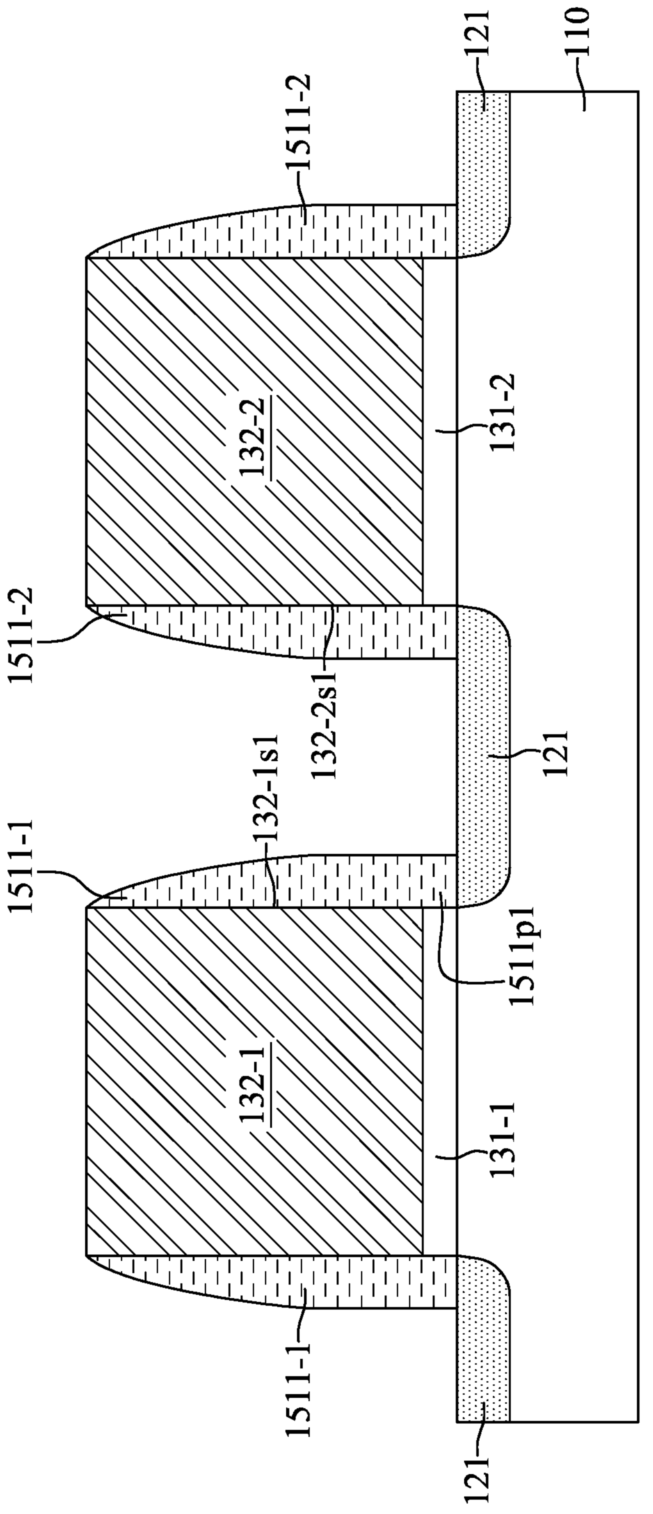
FIG. 7 illustrates one or more stages of an exemplary method for manufacturing a semiconductor device according to some embodiments of the present disclosure.

Referring to FIG. 7, an etching technique may be performed. The dielectric layer 1511*a* may be patterned to form a spacer 1511-1 on a sidewall 132-1*s*1 of the first gate electrode 132-1 and a spacer 1511-2 on a sidewall 132-2*s*1 of the second gate electrode 132-2. The substrate 110 may be exposed.

Figure 8:
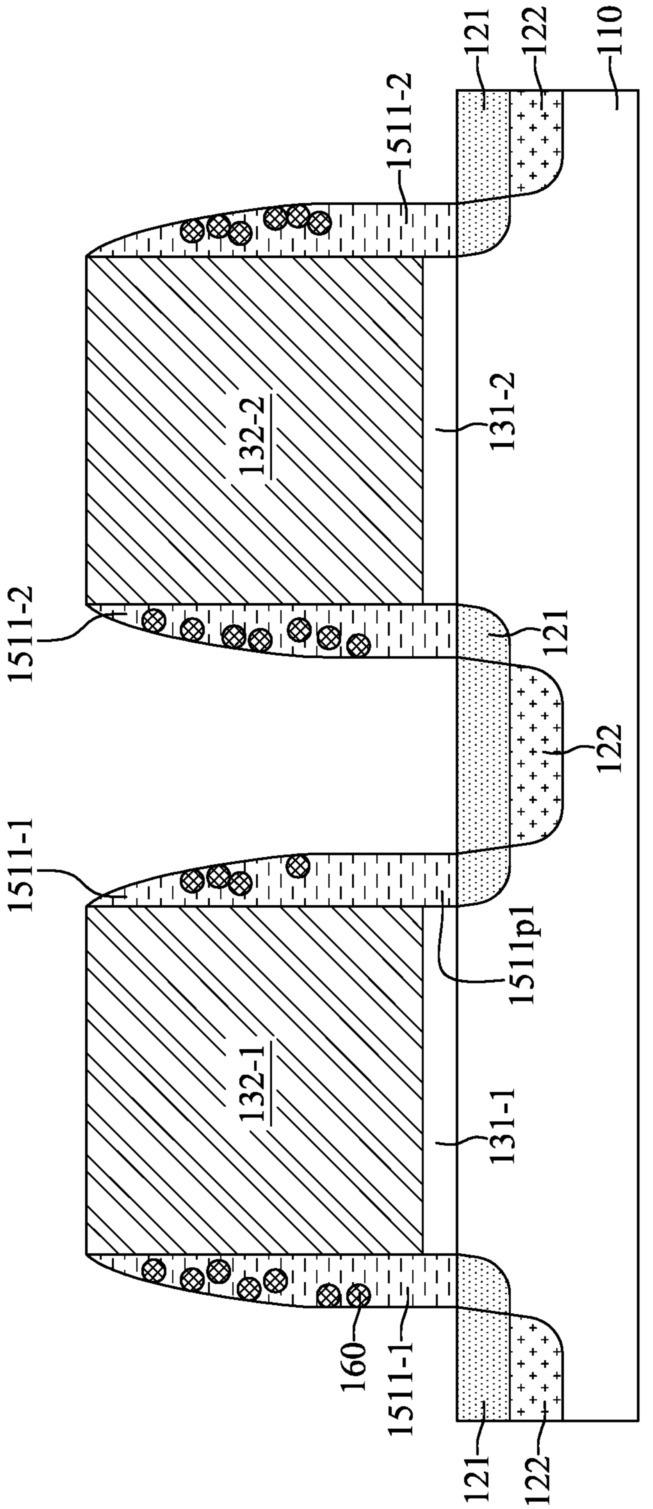
FIG. 8 illustrates one or more stages of an exemplary method for manufacturing a semiconductor device according to some embodiments of the present disclosure.

Referring to FIG. 8, a lightly-doped region 122 may be formed in the substrate 110 and between the spacers 1511-1 and 1511-2. In some embodiments, the spacers 1511-1 and 1511-2 may be doped with dopants 160. In some embodiments, the dopants 160 may be located adjacent to an external surface of the spacer 1511-1 or an interface between the spacers 1511-1 and 1511-2.

A dimension of the lightly-doped region 122 may be determined by a distance between the spacers 1511-1 and 1511-2.

Figure 9:
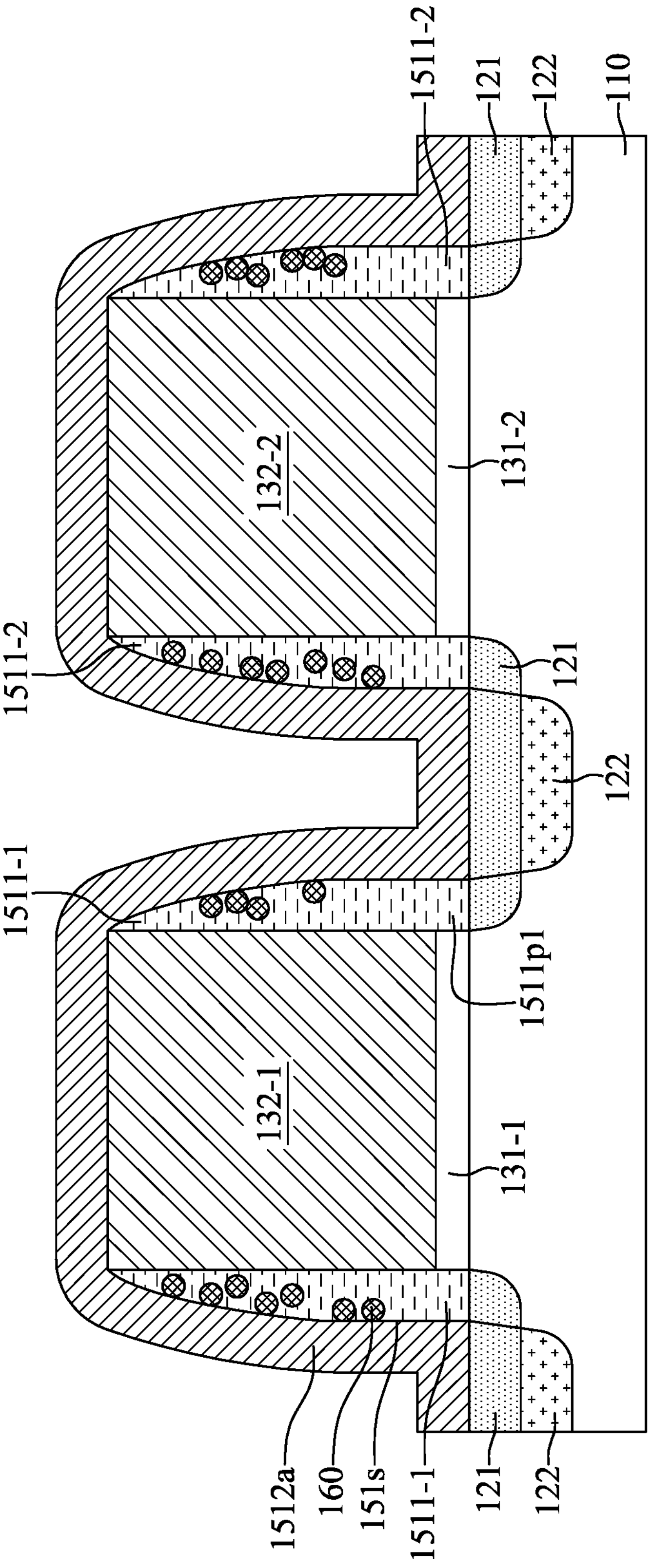
FIG. 9 illustrates one or more stages of an exemplary method for manufacturing a semiconductor device according to some embodiments of the present disclosure.

Referring to FIG. 9, a dielectric layer 1512*a* may be formed to cover the gate electrodes 132-1 and 132-2. The dielectric layer 1512*a* may cover the spacers 1511-1 and 1511-2. The dielectric layer 1512*a* may cover the substrate 110. The dielectric layer 1512*a* may be formed by, for example, CVD, ALD, PVD, LPCVD, PECVD, or other suitable processes. A material of the dielectric layer 1512*a* may be same as that of the dielectric layer 1511*a*.

Figure 10:
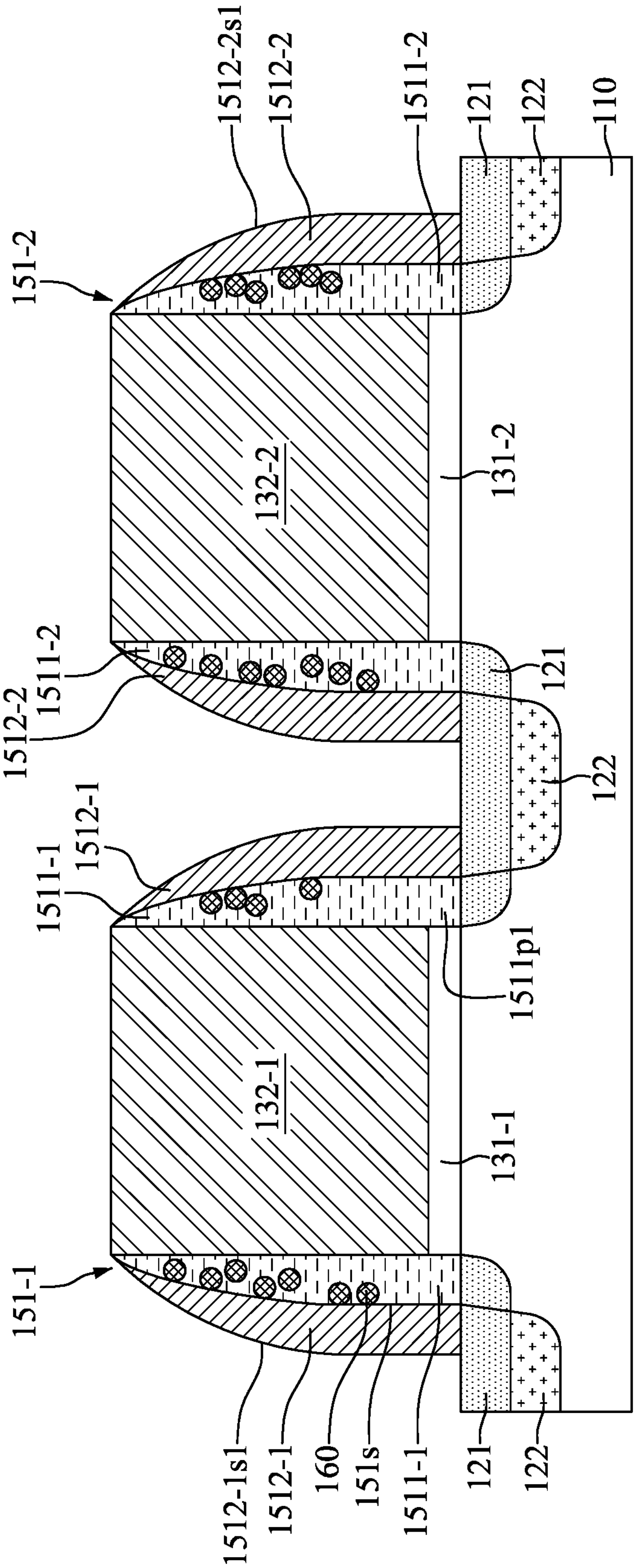
FIG. 10 illustrates one or more stages of an exemplary method for manufacturing a semiconductor device according to some embodiments of the present disclosure.

Referring to FIG. 10, an etching technique may be performed. The dielectric layer 1512*a* may be patterned to form a spacer 1512-1 on the spacer 1511-1 and to form a spacer 1512-2 on the spacer 1511-2. The substrate 110 may be exposed. Spacer structures 151-1 and 151-2 may be thereby formed.

Figure 11:
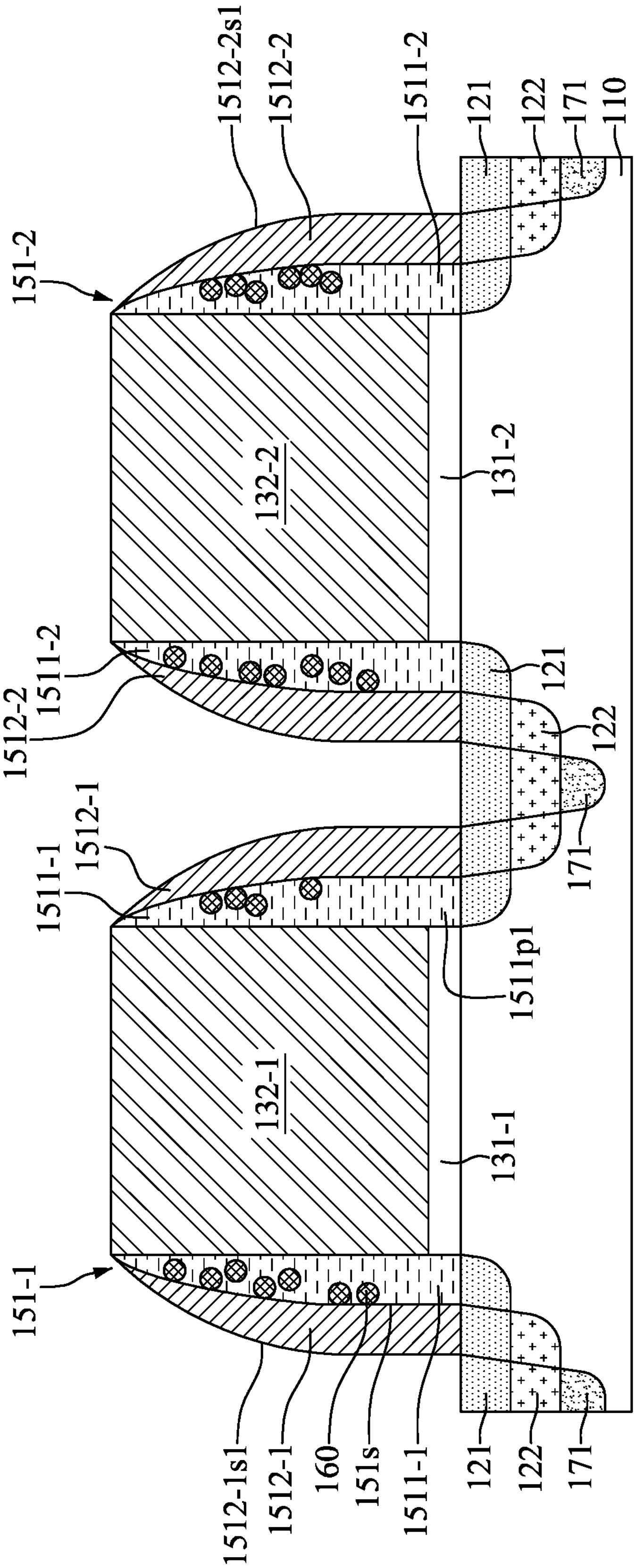
FIG. 11 illustrates one or more stages of an exemplary method for manufacturing a semiconductor device according to some embodiments of the present disclosure.

Referring to FIG. 11, a heavily-doped region 171 may be formed within the substrate 110 and between the spacers 1512-1 and 1512-2. A dimension of the lightly-doped region 122 may be determined by a distance between the spacers 1512-1 and 1512-2.

Figure 12:
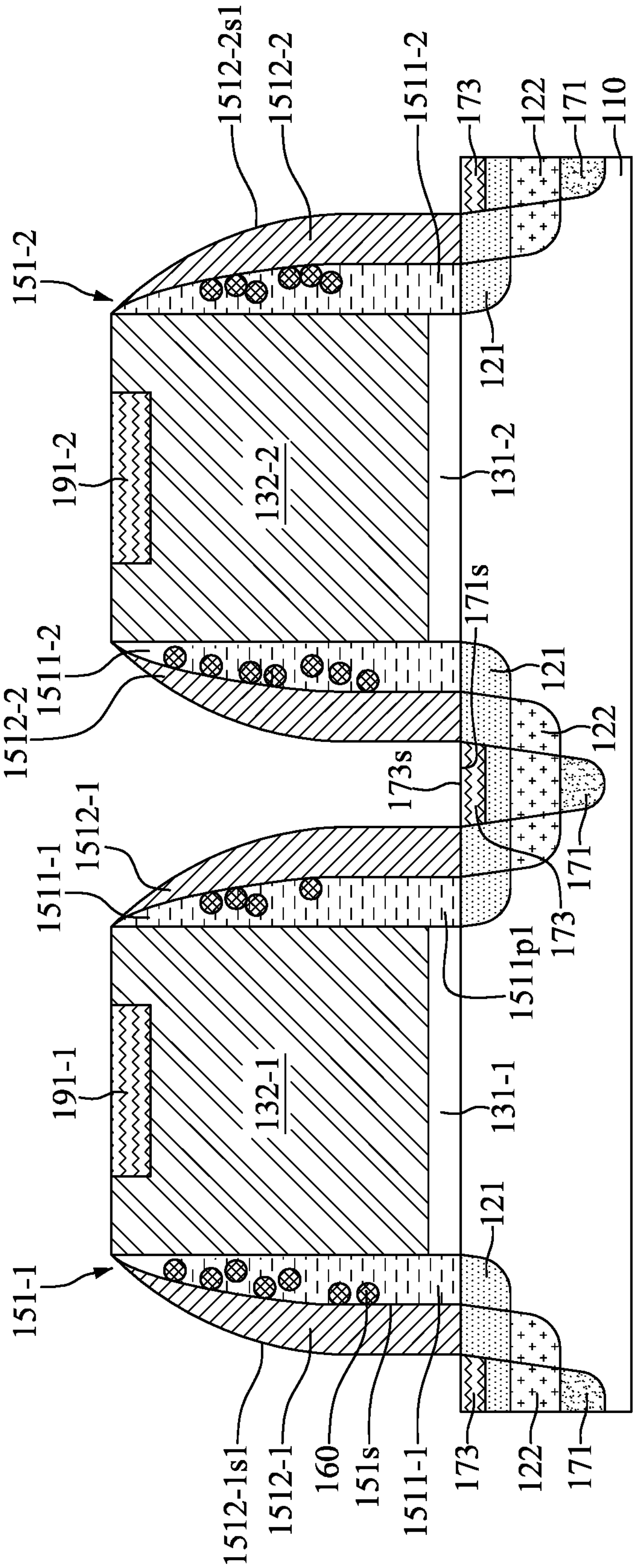
FIG. 12 illustrates one or more stages of an exemplary method for manufacturing a semiconductor device according to some embodiments of the present disclosure.

Referring to FIG. 12, a thermal process is performed to at least cause portions of the substrate 110 between the first gate electrode 132-1 and the second gate electrode 132-2 to be formed into second metal contacts 173, and to cause top portions of the first gate electrode 132-1 and the second gate electrode 132-2 to be formed into first metal contacts 191-1 and 191-2 respectively. In some embodiments, the second metal contacts 173 and the first metal contacts 191-1 and 191-2 are metal silicide contacts. In some embodiments, the thermal process utilized to form the second metal contacts 173 and the first metal contacts 191-1 and 191-2 is preferably a rapid thermal annealing (RTA) process.

Figure 13:
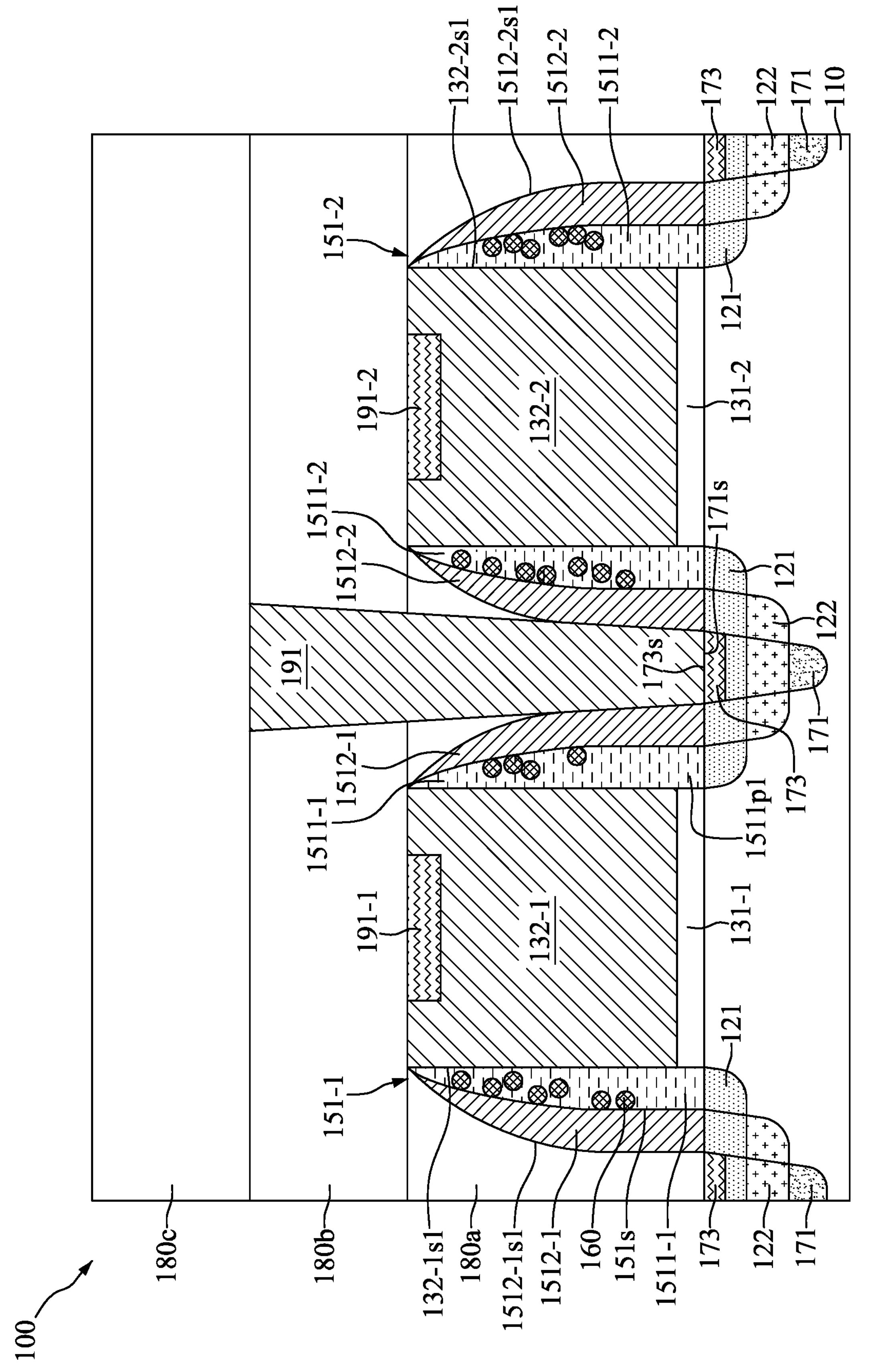
FIG. 13 illustrates one or more stages of an exemplary method for manufacturing a semiconductor device according to some embodiments of the present disclosure.

Referring to FIG. 13, a first dielectric structure 180*a* may be formed to cover the substrate 110, wherein the first dielectric structure 180*a* is located between the first gate electrode 132-1 and the second gate electrode 132-2. In some embodiments, a top surface 180*a*-*s*1 of the first dielectric structure 180*a* may be coplanar with a top surface 132-1*s* of the first gate electrode 132-1; and the top surface 180*a*-s1 of the first dielectric structure 180*a* may be coplanar with a top surface 132-2*s* of the second gate electrode 132-2. The first dielectric structure 180*a* may cover the spacer structure 151-1. The first dielectric structure 180*a* may cover the spacer structure 151-2. The first dielectric structure 180*a* may cover the spacer 1511-1. The first dielectric structure 180*a* may cover the spacer 1512-1. The first dielectric structure 180*a* may cover the spacer 1511-2. The first dielectric structure 180*a* may cover the spacer 1512-2. A second dielectric structure 180*b* may be formed to cover the first dielectric structure 180*a* and the gate electrodes 132-1 and 132-2. A conductive element 191 may be formed to connect to the second metal contact 173 formed in the heavily-doped region 171. As a result, a semiconductor device 100 as shown in FIG. 1 is produced.

FIGS. 14 to 22 illustrate one or more stages of an exemplary method for manufacturing a semiconductor device 200 based on the semiconductor device 100 according to some embodiments of the present disclosure.

Figure 14:
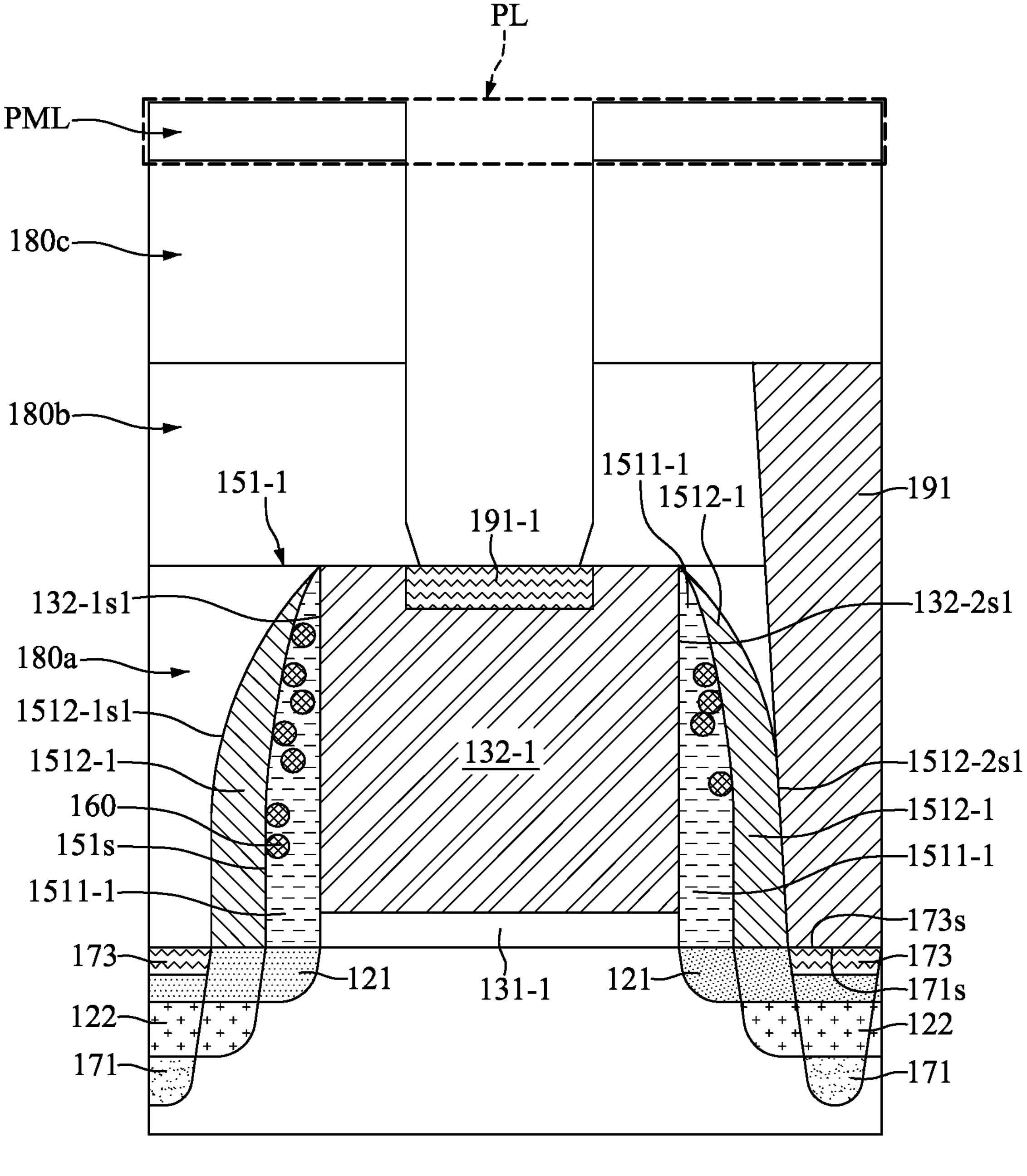
FIG. 14 illustrates one or more stages of an exemplary method for manufacturing a semiconductor device according to some embodiments of the present disclosure.

As shown in FIG. 14, a photoresist layer PL is patterned to form a patterned mask layer PML on a third dielectric structure 180*c*. A material of the patterned mask layer PML is same as a material of the photoresist layer PL. The photoresist layer PL is patterned by performing a photolithography process. The photoresist layer PL is exposed to a processing light in accordance with a mask (not shown). A wavelength of the processing light is associated with a critical dimension of a trench TR (shown in FIG. 16). In some embodiments, the processing light is a deep ultraviolet (DUV) radiation. In other embodiments, the processing light is an extreme ultraviolet (EUV) radiation, and the photolithography process is EUV lithography. After the exposure to the processing light, a pattern on the mask is transferred to the photoresist layer PL. The photoresist layer PL is then etched according to the transferred pattern so as to form the patterned mask layer PML.

Figure 15:
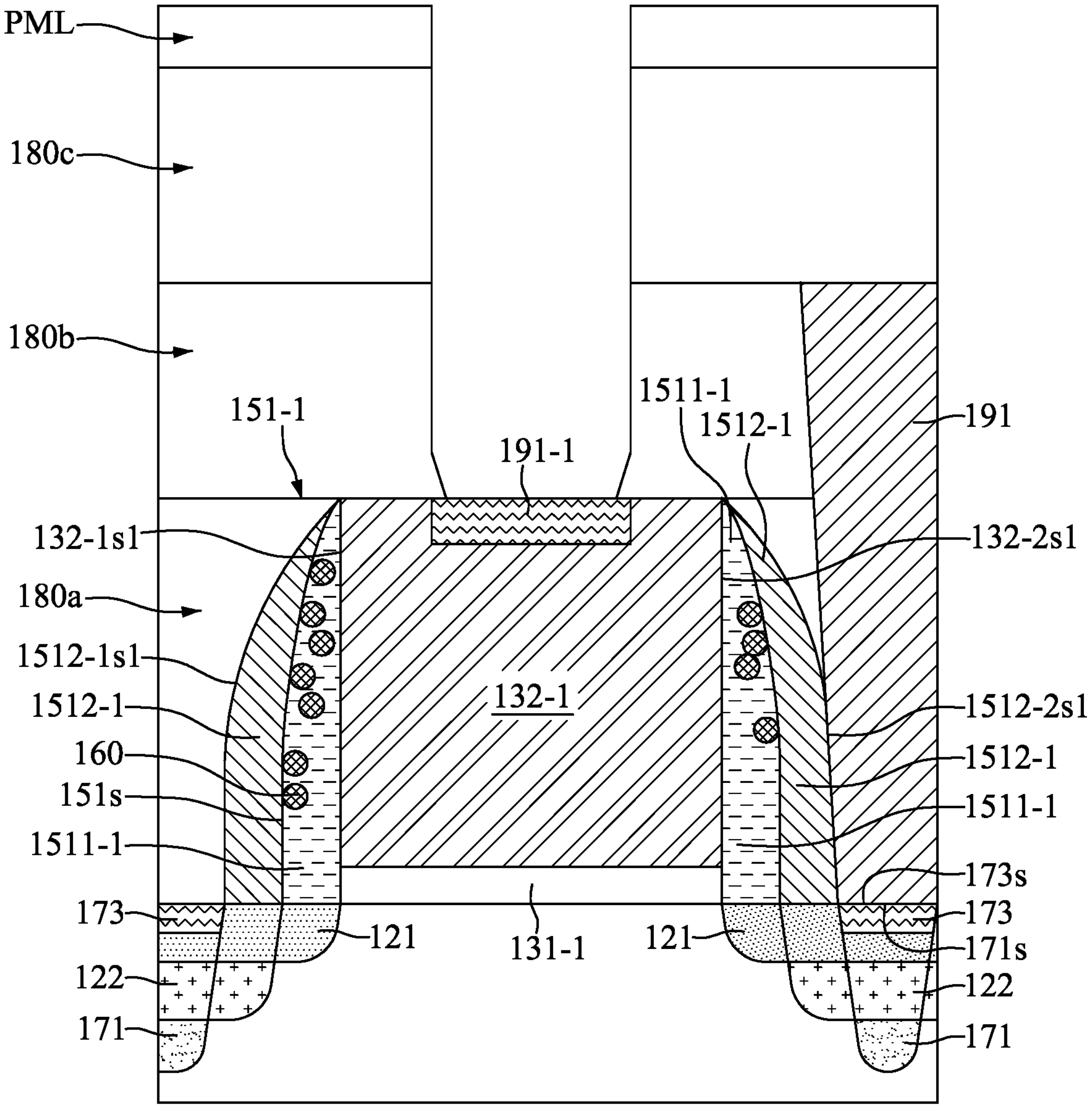
FIG. 15 illustrates one or more stages of an exemplary method for manufacturing a semiconductor device according to some embodiments of the present disclosure.
Figure 16:
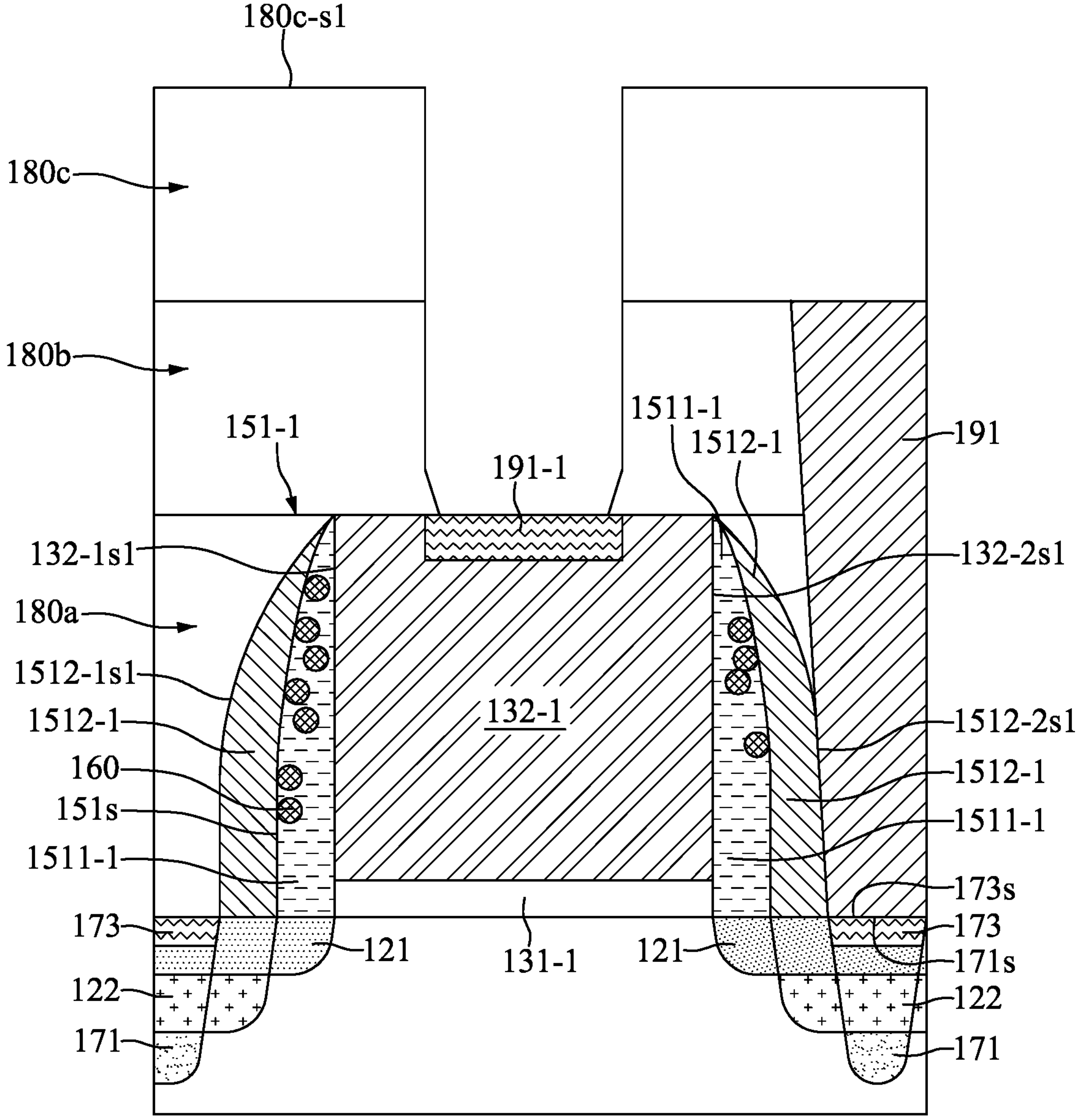
FIG. 16 illustrates one or more stages of an exemplary method for manufacturing a semiconductor device according to some embodiments of the present disclosure.

As illustrated in FIG. 15, a third dielectric structure 180*c* and the second dielectric structure 180*b* are etched in accordance with the patterned mask layer PML, and a top surface 191-1*s* of a metal contact 191-1 is exposed after etching. In some embodiments, the third dielectric structure 180*c*, the second dielectric structure 180*b*, and a first dielectric structure 180*a* are etched by a dry etching process such as reactive ion etching (RIE). In the embodiment of FIG. 16, the top surface 191-1*s* of the first metal contact 191-1 is partially exposed. However, the present disclosure is not limited thereto. In some embodiments, the top surface 191-1*s* of the first metal contact 191-1 is entirely exposed after the etching.

As illustrated in FIG. 16, the patterned mask layer PML is removed to expose a top surface 180*c*-*s*1 of the third dielectric structure 180*c*, and the trench TR is formed. In some embodiments, the trench TR is wider at the third dielectric structure 180*c* and a portion of the second dielectric structure 180*b* away from the first metal contact 191-1, and the trench TR is narrower at a portion of the second dielectric structure 180*b* adjacent to the first metal contact 191-1, as illustrated in FIG. 16.

Figure 17:
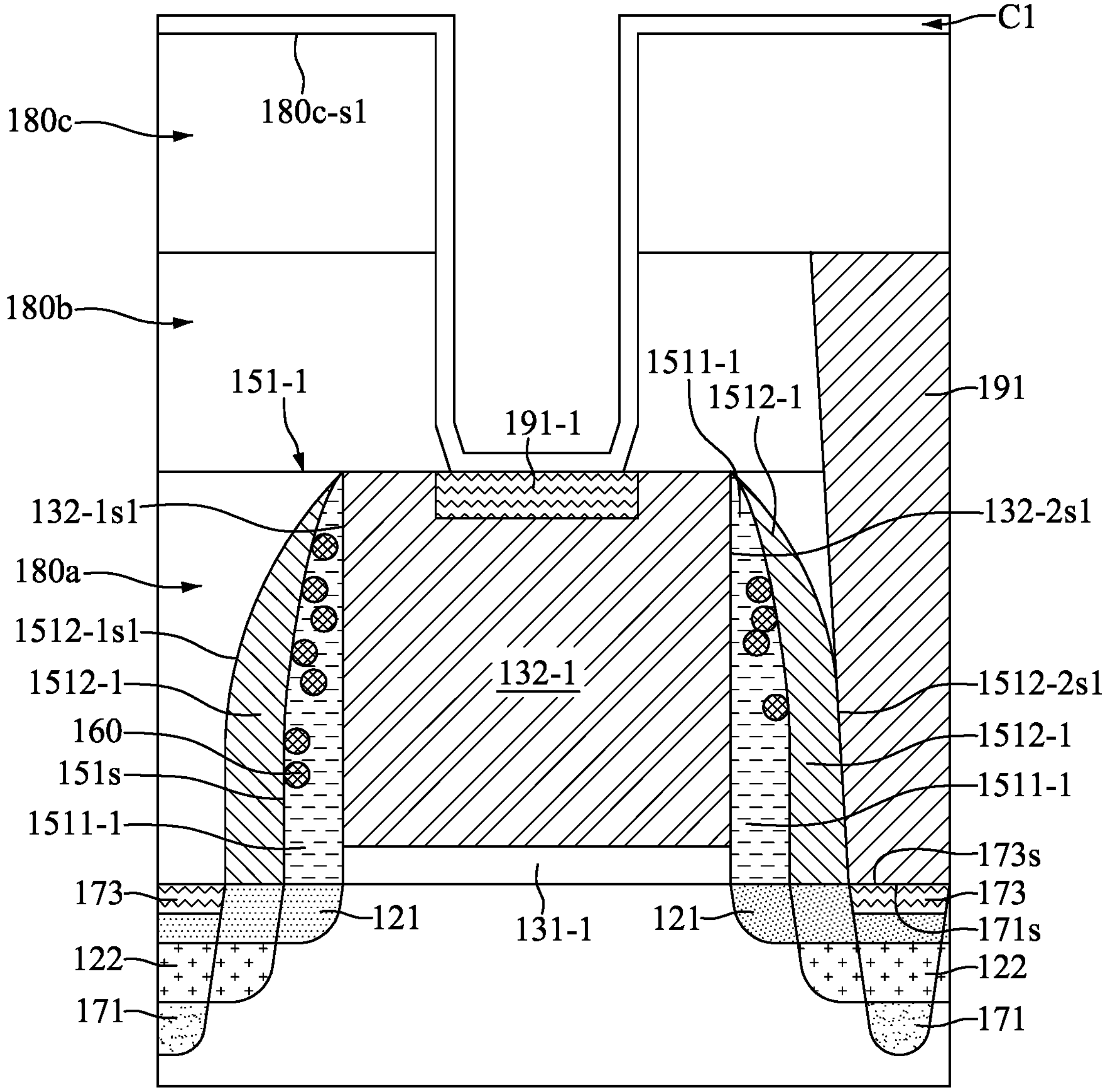
FIG. 17 illustrates one or more stages of an exemplary method for manufacturing a semiconductor device according to some embodiments of the present disclosure.

As illustrated in FIG. 17, a bottom metal layer C1 is deposited over the third dielectric structure 180*c* and along a contour of the trench TR. In some embodiments, the bottom metal layer C1 is deposited by performing a CVD process. The bottom metal layer C1 has a substantially uniform thickness along the contour of the trench TR. As illustrated in FIG. 17, the bottom metal layer C1 includes a horizontal portion C1H and a vertical portion C1V. The horizontal portion C1H is in contact with the top surface 191-1*s* of the first metal contact 191-1, and the vertical portion C1V is in contact with a sidewall SW5 of the second dielectric structure 180*b*, a first portion SW61 of a sidewall of the third dielectric structure 180*c*, and a second portion SW62 of the sidewall of the third dielectric structure 180*c*.

Figure 18:
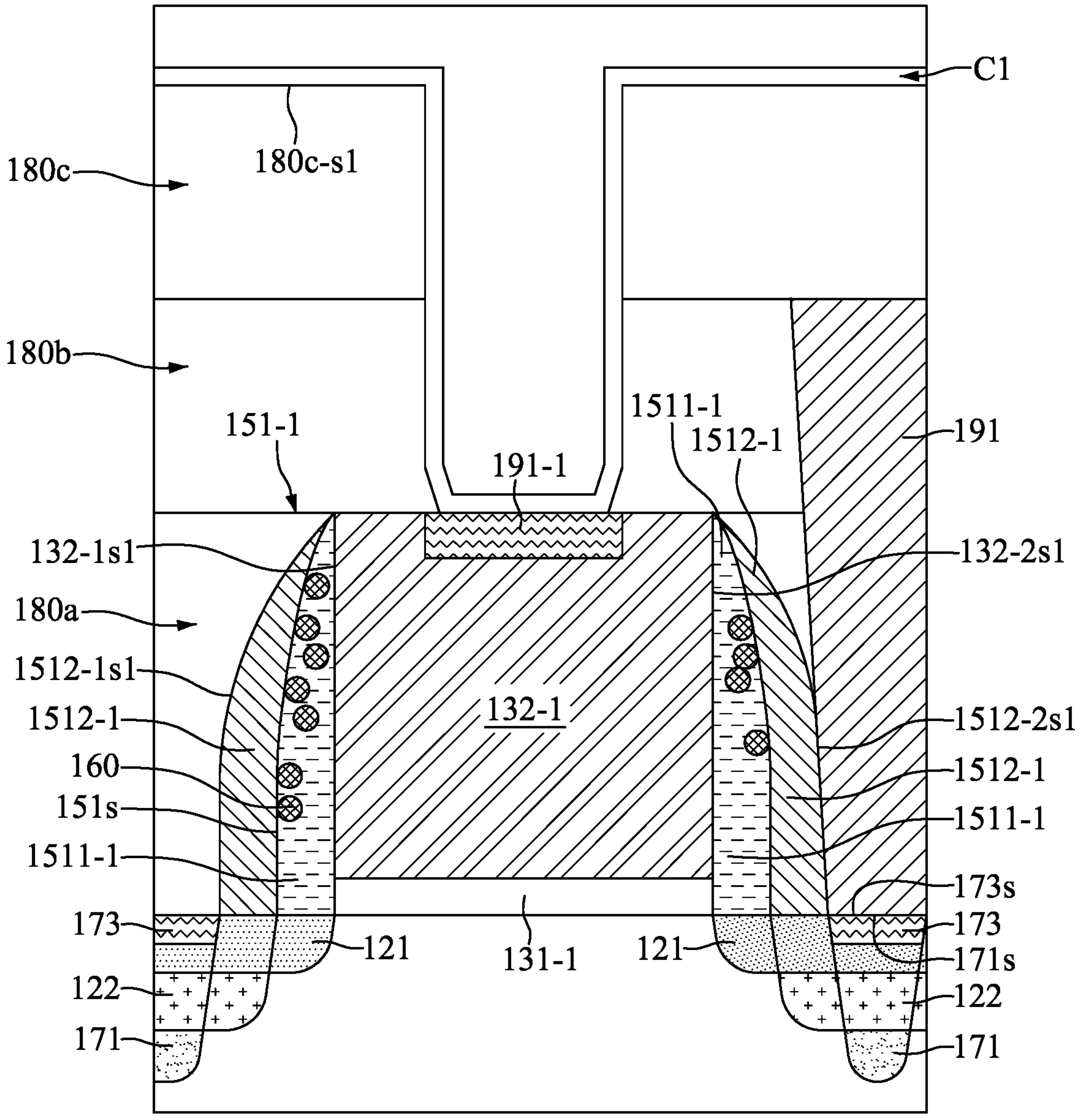
FIG. 18 illustrates one or more stages of an exemplary method for manufacturing a semiconductor device according to some embodiments of the present disclosure.

As illustrated in FIG. 18, a sacrificial oxide layer SO is deposited over the bottom metal layer C1. The sacrificial oxide layer SO has a T shape to fill the trench TR and cover the bottom metal layer C1 over the third dielectric structure 180*c*.

Figure 19:
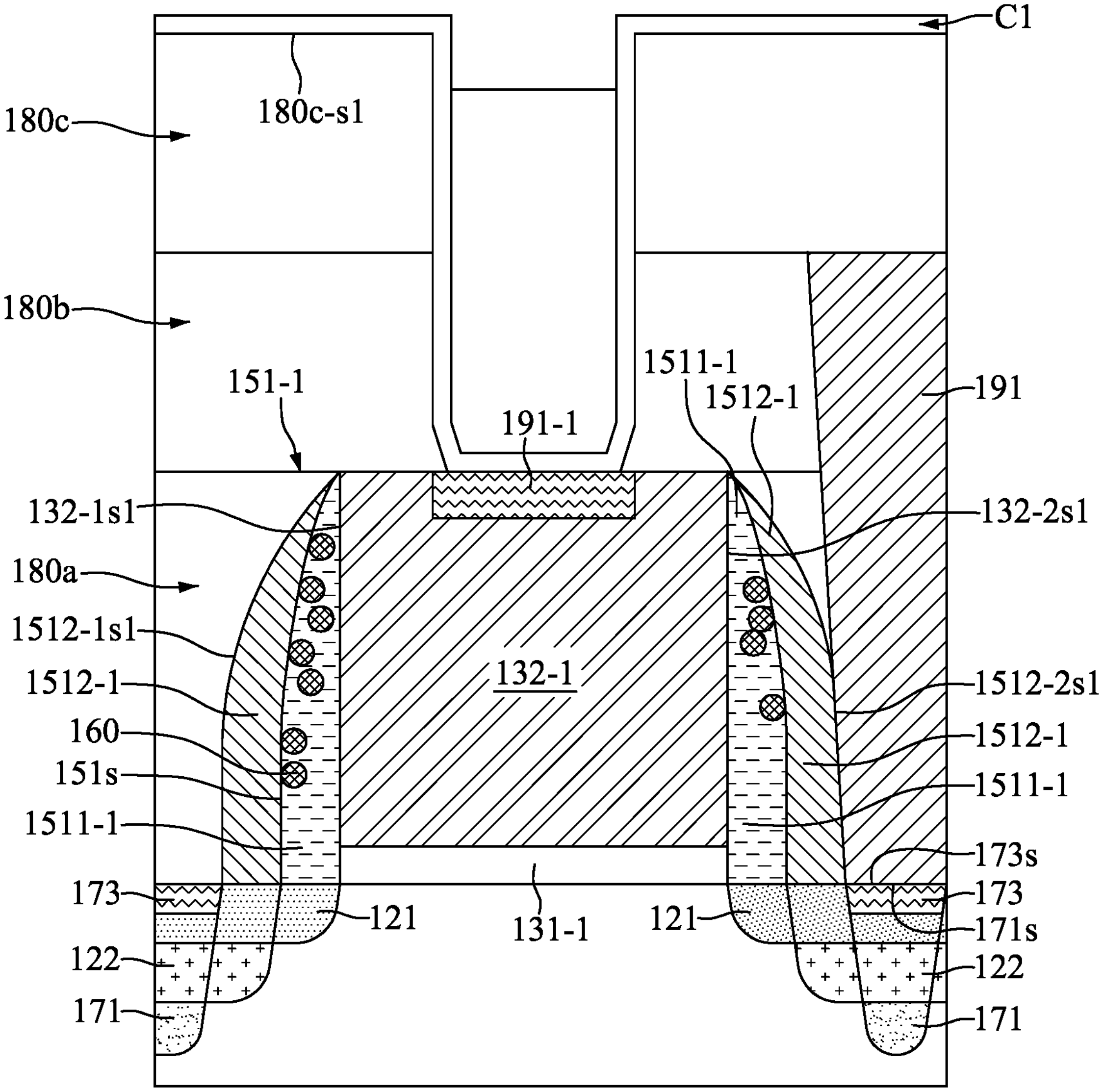
FIG. 19 illustrates one or more stages of an exemplary method for manufacturing a semiconductor device according to some embodiments of the present disclosure.

As illustrated in FIG. 19, the sacrificial oxide layer SO is etched to form a recess. More specifically, the sacrificial oxide layer SO is etched to a level corresponding to a boundary between the first portion SW61 of the sidewall and the second portion SW62 of the sidewall. As a result, a portion of the sacrificial oxide layer SO above the first portion SW61 of the sidewall is etched.

Figure 20:
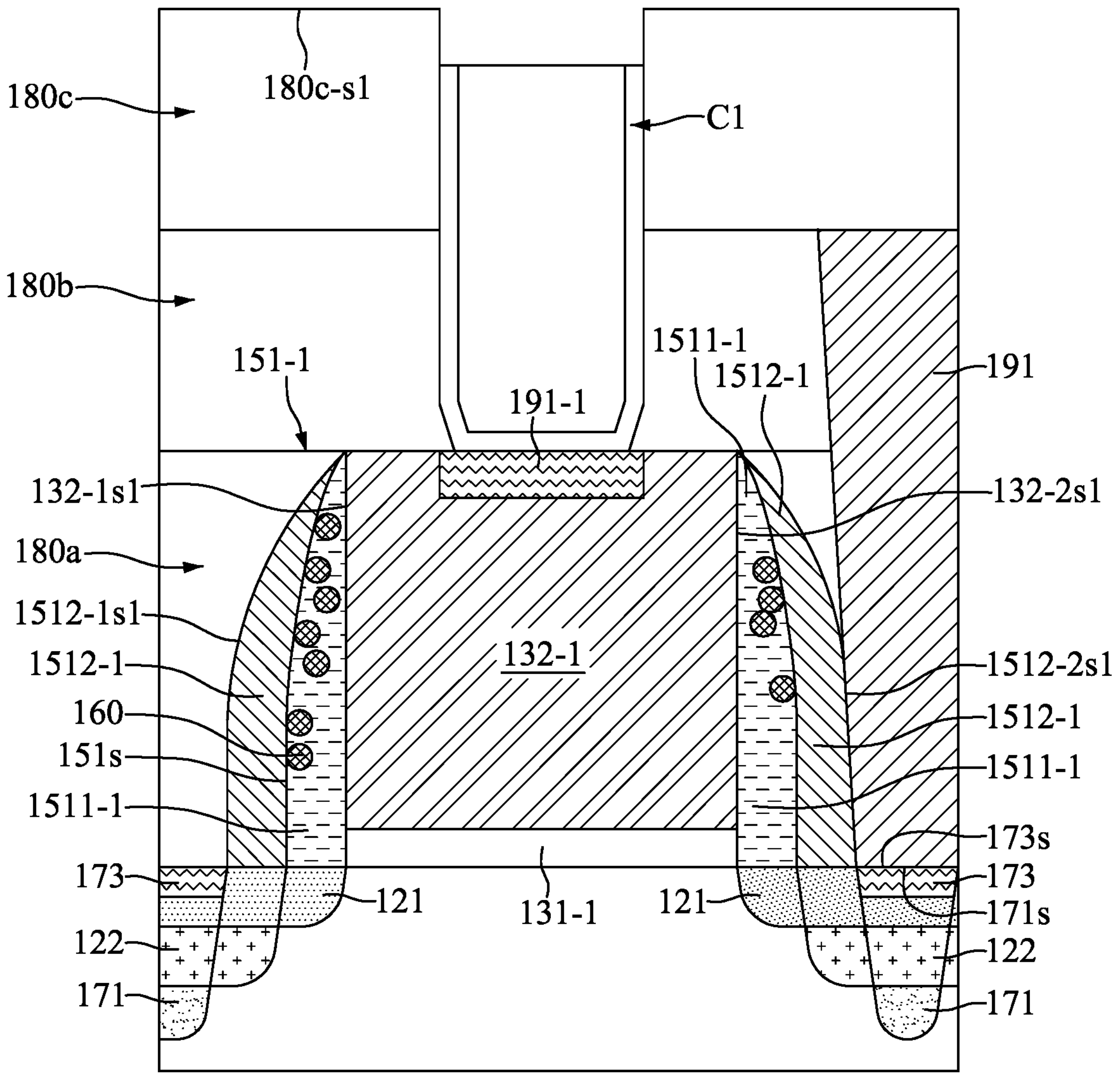
FIG. 20 illustrates one or more stages of an exemplary method for manufacturing a semiconductor device according to some embodiments of the present disclosure.

As illustrated in FIG. 20, the bottom metal layer C1 is etched to expose a top surface TSC1 of the vertical portion C1V of the bottom metal layer C1 and the second portion SW62 of the sidewall of the third dielectric structure 180*c*. The bottom metal layer C1 is etched to cause the top surface TSC1 to be coplanar with a top surface of the sacrificial oxide layer SO. In some embodiments, hydrogen fluoride (HF), nitrogen trifluoride ($NF_3$), carbon tetrafluoride ($CF_4$), sulphur hexafluoride ($SF_6$), or a combination thereof are used as etchants to etch the bottom metal layer C1. In some embodiments, the etching is performed at atmospheric pressure and at a temperature of about 285° to 300° Celsius.

Figure 21:
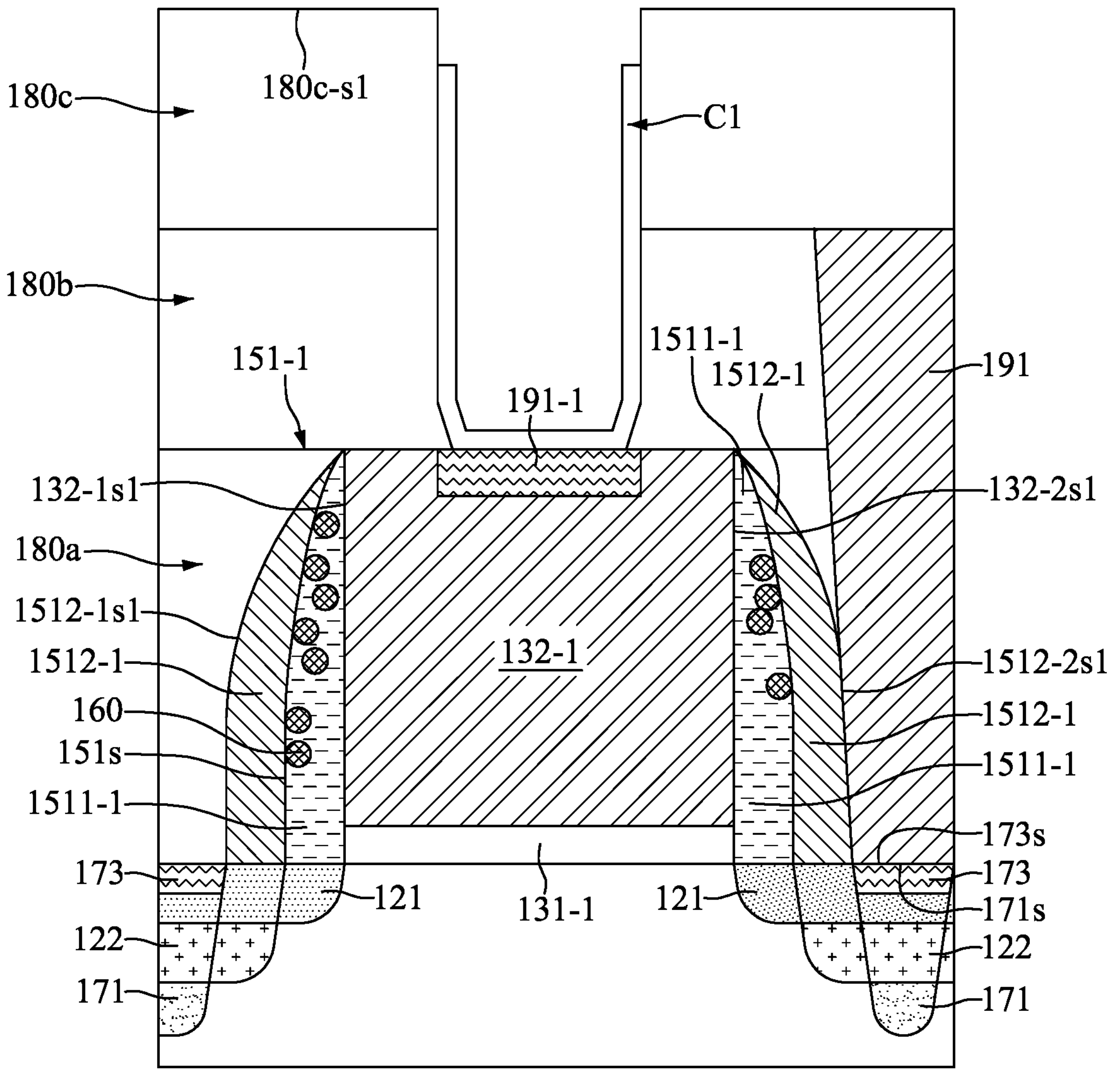
FIG. 21 illustrates one or more stages of an exemplary method for manufacturing a semiconductor device according to some embodiments of the present disclosure.

As illustrated in FIG. 21, a remainder of the sacrificial oxide layer SO is removed to expose a remaining portion of the bottom metal layer C1. In some embodiments, the remainder of the sacrificial oxide layer SO is removed by performing a wet etching.

Figure 22:
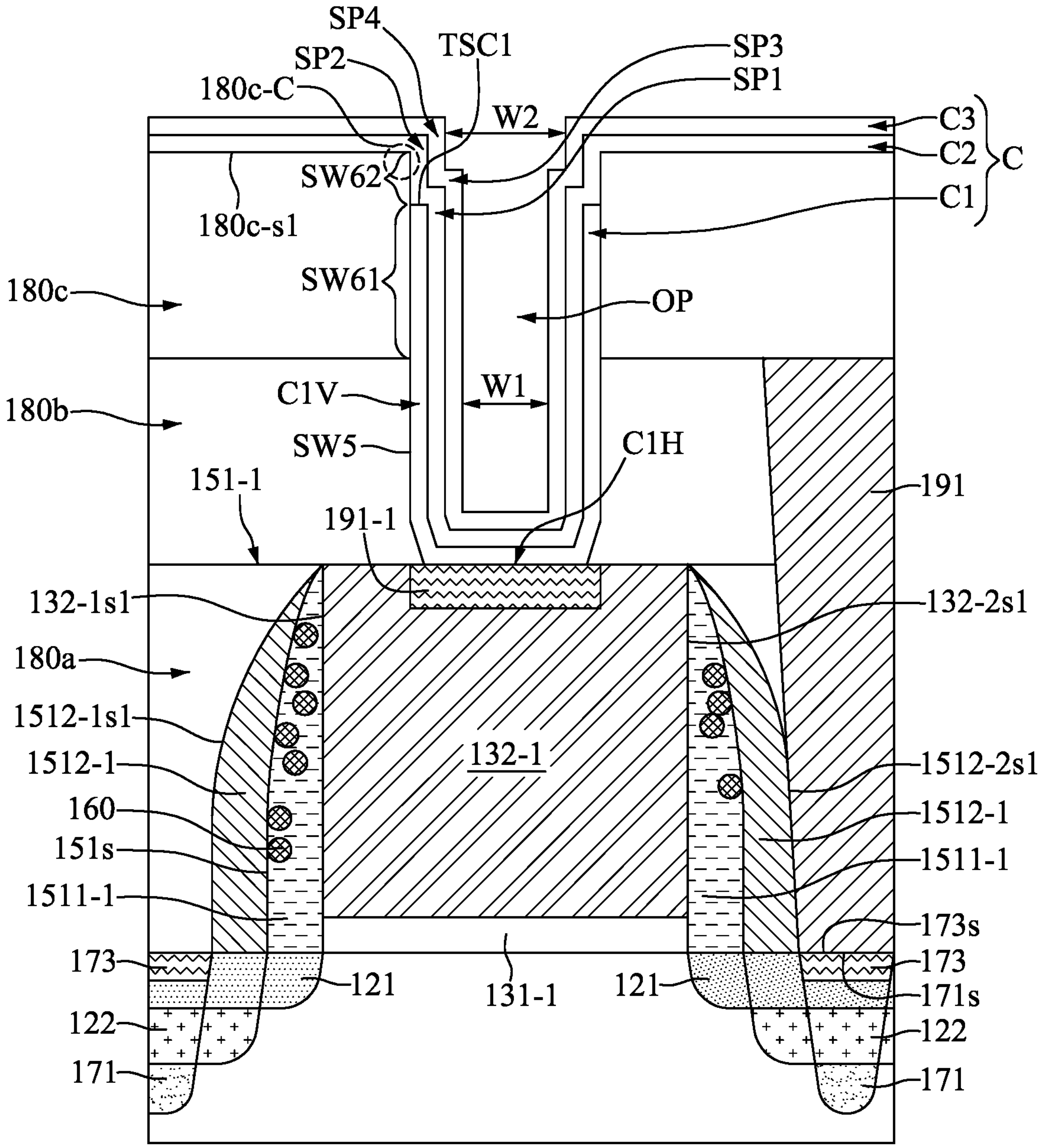
FIG. 22 illustrates one or more stages of an exemplary method for manufacturing a semiconductor device according to some embodiments of the present disclosure.

As illustrated in FIG. 22, a middle insulating layer C2 is deposited over the bottom metal layer C1. More specifically, the middle insulating layer C2 is deposited to cover the bottom metal layer C1, the second portion SW62 of the sidewall, and the top surface 181*c*-s1 of the third dielectric structure 180*c*. As illustrated in FIG. 22, the middle insulating layer C2 includes a first step portion SP1 and a second step portion SP2. The first step portion SP1 is in contact with the vertical portion C1V and the top surface TSC1 of the bottom metal layer C1, and the second step portion SP2 is in contact with the second portion SW62 of the sidewall and the top surface 181*c*-s1 of the third dielectric structure 180*c*. As a result, the second step portion SP2 covers a corner 180*c*-C of the third dielectric structure 180*c*, wherein the corner 180*c*-C is defined by the top surface 180*c-s*1 and the second portion SW62 of the sidewall of the third dielectric structure 180*c*.

After the middle insulating layer C2 is deposited, a top metal layer C3 is deposited over the middle insulating layer C2 to form the semiconductor structure 200 as illustrated in FIG. 2.

One aspect of the present disclosure provides a semiconductor device. The semiconductor device includes a substrate; a gate electrode disposed on the substrate; a first metal contact disposed in the gate electrode; a first spacer disposed on a sidewall of the gate electrode; and a second spacer covering the first spacer; wherein the first spacer is doped with dopants.

Another aspect of the present disclosure provides a semiconductor device. The semiconductor device includes a substrate; a gate electrode disposed on the substrate; a first metal contact disposed in the gate electrode; a first spacer disposed on a sidewall of the gate electrode; and a trench capacitor disposed over the first metal contact and being in contact with the first metal contact.

Another aspect of the present disclosure provides a method for manufacturing a semiconductor device. The method includes: providing a substrate and forming a first gate electrode and a second gate electrode over the substrate; forming a first lightly-doped region within the substrate and between the first gate electrode and the second gate electrode; forming a first dielectric layer to cover the first gate electrode, the second gate electrode, and the substrate; performing an etching technique to pattern the first dielectric layer; forming a first spacer on a sidewall of the first gate electrode; forming a second spacer on a sidewall of the second gate electrode, wherein the substrate is exposed by the first spacer and the second spacer; forming a second lightly-doped region within the substrate and between the first spacer and the second spacer; forming a second dielectric layer to cover the first spacer, the second spacer, the first gate electrode, the second gate electrode, and the substrate; performing an etching technique to pattern the second dielectric layer; forming a third spacer to cover the first spacer; forming a fourth spacer to cover the second spacer, wherein the substrate is exposed; forming a heavily-doped region within the substrate and between the third spacer and the fourth spacer; forming first metal contacts in the first gate electrode and the second gate electrode; forming a second metal contact in the heavily-doped region and located between the first gate electrode and the second gate electrode; forming a first dielectric structure over the substrate and between the first gate electrode and the second gate electrode; forming a second dielectric structure over the first dielectric structure; forming a third dielectric structure over the second dielectric structure; and forming a trench capacitor to penetrate the third dielectric structure and the second dielectric structure to reach and contact the first metal contacts formed in the first gate electrode and the second gate electrode.

The embodiments of the present disclosure provide a method for preparing a semiconductor device. The method includes at least two cycles of depositing dielectric layers and patterning the dielectric layers, thereby defining multiple spacers. The spacers defined by the first cycle can be used to define a lightly-doped region of a different profile. Further, by performing multiple cycles of forming spacers, a dimension of the entire spacer can be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
- a substrate;
- a gate electrode disposed on the substrate;
- a first metal contact disposed in the gate electrode;
- a first spacer disposed on a sidewall of the gate electrode; and
- a second spacer covering an outer surface of the first spacer,
- wherein the first spacer and the second spacer are disposed on the substrate;
- wherein a surface roughness of the outer surface of the first spacer is greater than a surface roughness of an outer surface of the second spacer;
- wherein the first spacer comprises dopants located along the outer surface of the first spacer.

2. The semiconductor device of claim 1, further comprising:
- a first lightly doped region disposed within the substrate and adjacent to the gate electrode; and
- a second lightly doped region disposed within the substrate below the first lightly doped region, wherein a dimension of the first lightly doped region is different from a dimension of the second lightly doped region;
- wherein the first lightly doped region is overlapped on the second lightly doped region and is formed between the second spacer and the second lightly doped region;
- wherein the first spacer and the second spacer are in direct contact with the first lightly doped region.

3. The semiconductor device of claim 2, wherein the dimension of the second lightly doped region is determined by a thickness of the first spacer.

4. The semiconductor device of claim 2, wherein a portion of the first spacer is free from vertically overlapping the second lightly doped region.

5. The semiconductor device of claim 2, further comprising:

a heavily doped region disposed within the substrate and adjacent to the second spacer;

wherein the heavily doped region is formed below the second lightly doped region, such that the second lightly doped region is overlapped between the first lightly dope region and the heavily doped region;

wherein a dopant concentration of the second lightly-doped region is less than that of the heavily-doped region;

wherein a width of the first lightly-doped region is larger than a width of the second lightly-doped region which is larger than a width of the heavily lightly-doped region.

6. The semiconductor device of claim 1, wherein the dopants are located adjacent to an interface between the first spacer and the second spacer, wherein the interface is formed along the outer surface of the first spacer.

7. The semiconductor device of claim 1 wherein a top surface of the first metal contact is coplanar with a top surface of the gate electrode.

8. The semiconductor device of claim 1, further comprising:

a conductive via penetrating the second spacer and in contact with the second spacer;

wherein the conductive via is separated from the first spacer by the second spacer.

9. The semiconductor device of claim 1, further comprising:

a second metal contact disposed in the substrate and in the first lightly doped region, wherein a top surface of the second metal contact is coplanar with a top surface of the first lightly doped region.

10. The semiconductor device of claim 1, wherein a material of the first spacer is the same as that of the second spacer.

11. The semiconductor device of claim 7, further comprising:

a first dielectric structure disposed over the substrate and over the second spacer, wherein the first metal contact is exposed by the first dielectric structure;

wherein a top surface of the first dielectric structure, the top surface of the first metal contact, and the top surface of the gate electrode are coplanar with each other.

* * * * *